(12) United States Patent
Naraoka et al.

(10) Patent No.: US 9,184,414 B2
(45) Date of Patent: Nov. 10, 2015

(54) ORGANIC ELECTROLUMINESCENT ELEMENT AND LIGHTING DEVICE

(75) Inventors: Ryo Naraoka, Sodegaura (JP); Masahiko Fukuda, Sodegaura (JP); Hitoshi Kuma, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 450 days.

(21) Appl. No.: 13/576,420

(22) PCT Filed: Apr. 22, 2011

(86) PCT No.: PCT/JP2011/059935
§ 371 (c)(1),
(2), (4) Date: Aug. 1, 2012

(87) PCT Pub. No.: WO2011/132773
PCT Pub. Date: Oct. 27, 2011

(65) Prior Publication Data
US 2012/0286258 A1    Nov. 15, 2012

(30) Foreign Application Priority Data
Apr. 22, 2010    (JP) .................... 2010-099292

(51) Int. Cl.
*H01L 23/58*    (2006.01)
*H01L 51/52*    (2006.01)
(Continued)

(52) U.S. Cl.
CPC ......... *H01L 51/5275* (2013.01); *C09B 1/00* (2013.01); *C09B 3/02* (2013.01); *C09B 3/14* (2013.01);
(Continued)

(58) Field of Classification Search
CPC ........... H01L 51/5276; H01L 51/5268; H01L 2251/5369; H01L 2251/558
USPC ............................ 257/40, E51.018
See application file for complete search history.

(56) References Cited

U.S. PATENT DOCUMENTS

2005/0127832 A1    6/2005    Toguchi et al.
2006/0049745 A1    3/2006    Handa et al.
(Continued)

FOREIGN PATENT DOCUMENTS

CN    1759637 A    4/2006
CN    101060165 A    10/2007
(Continued)

OTHER PUBLICATIONS

Extended European Search Report issued Sep. 4, 2014 in Patent Application No. 11772104.3.
(Continued)

*Primary Examiner* — Michael Shingleton
(74) *Attorney, Agent, or Firm* — Oblon, McClelland, Maier & Neustadt, L.L.P.

(57) ABSTRACT

An organic EL device comprises: a light-transmissive substrate; a transparent electrode; an organic emitting layer; and an opposing electrode. A light-extraction layer provided by layering a high refractive index layer adjoining the transparent electrode and a low refractive index layer adjoining the light-transmissive substrate includes recess-protrusion units each provided by a protrusion and a recess at an interface between the high refractive index layer and the low refractive index layer. In at least one of the recess-protrusion units, a distance from the interface between the high refractive index layer and the low refractive index layer to an interface between the transparent electrode and the high refractive index layer is equal to or more than an optical coherence length and a height of the protrusion, a width of the protrusion and a gap between the protrusion and another protrusion adjoining the protrusion across the recess is 1 μm or more.

20 Claims, 18 Drawing Sheets

(51) Int. Cl.
*C09K 11/06* (2006.01)
*H05B 33/12* (2006.01)
*C09B 57/00* (2006.01)
*C09B 1/00* (2006.01)
*C09B 3/02* (2006.01)
*C09B 3/14* (2006.01)

(52) U.S. Cl.
CPC ............... *C09B 57/00* (2013.01); *C09B 57/008* (2013.01); *C09K 11/06* (2013.01); *H01L 51/5268* (2013.01); *H05B 33/12* (2013.01); *H01L 2251/5369* (2013.01); *H01L 2251/558* (2013.01)

(56) References Cited

U.S. PATENT DOCUMENTS

| | | |
|---|---|---|
| 2006/0284169 A1* | 12/2006 | Park et al. ................ 257/40 |
| 2007/0254162 A1 | 11/2007 | Kozaki et al. |
| 2008/0176041 A1 | 7/2008 | Sato et al. |
| 2009/0066219 A1 | 3/2009 | Handa et al. |
| 2009/0066220 A1 | 3/2009 | Handa et al. |
| 2011/0175116 A1 | 7/2011 | Usami |
| 2012/0286258 A1* | 11/2012 | Naraoka et al. ........... 257/40 |

FOREIGN PATENT DOCUMENTS

| | | |
|---|---|---|
| GB | 2 439 231 A | 12/2007 |
| JP | 8 83688 | 3/1996 |
| JP | 2003 297572 | 10/2003 |
| JP | 2004 296438 | 10/2004 |
| JP | 2005 274741 | 10/2005 |
| JP | 2005 317228 | 11/2005 |
| JP | 2005 327689 | 11/2005 |
| JP | 2006 294491 | 10/2006 |
| JP | 2007 287486 | 11/2007 |
| JP | 2007 335253 | 12/2007 |
| JP | 4073510 | 2/2008 |
| JP | 2008 66027 | 3/2008 |
| JP | 4140541 | 6/2008 |
| JP | 4253302 | 1/2009 |
| JP | 4386285 | 10/2009 |
| JP | 2009 272059 | 11/2009 |
| WO | WO 2010/032652 A1 | 3/2010 |

OTHER PUBLICATIONS

U.S. Appl. No. 13/792,600, filed Mar. 11, 2013, Naraoka, et al.
Combined Chinese Office Action and Search Report issued Dec. 31, 2014 in Patent Application No. 201180007505.5 (with English Translation and English Translation of Category of Cited Documents).
Dai Fu Long , "Modem Light Measurement Mechanism", First edition, Oct. 1990, 6 pages.

* cited by examiner

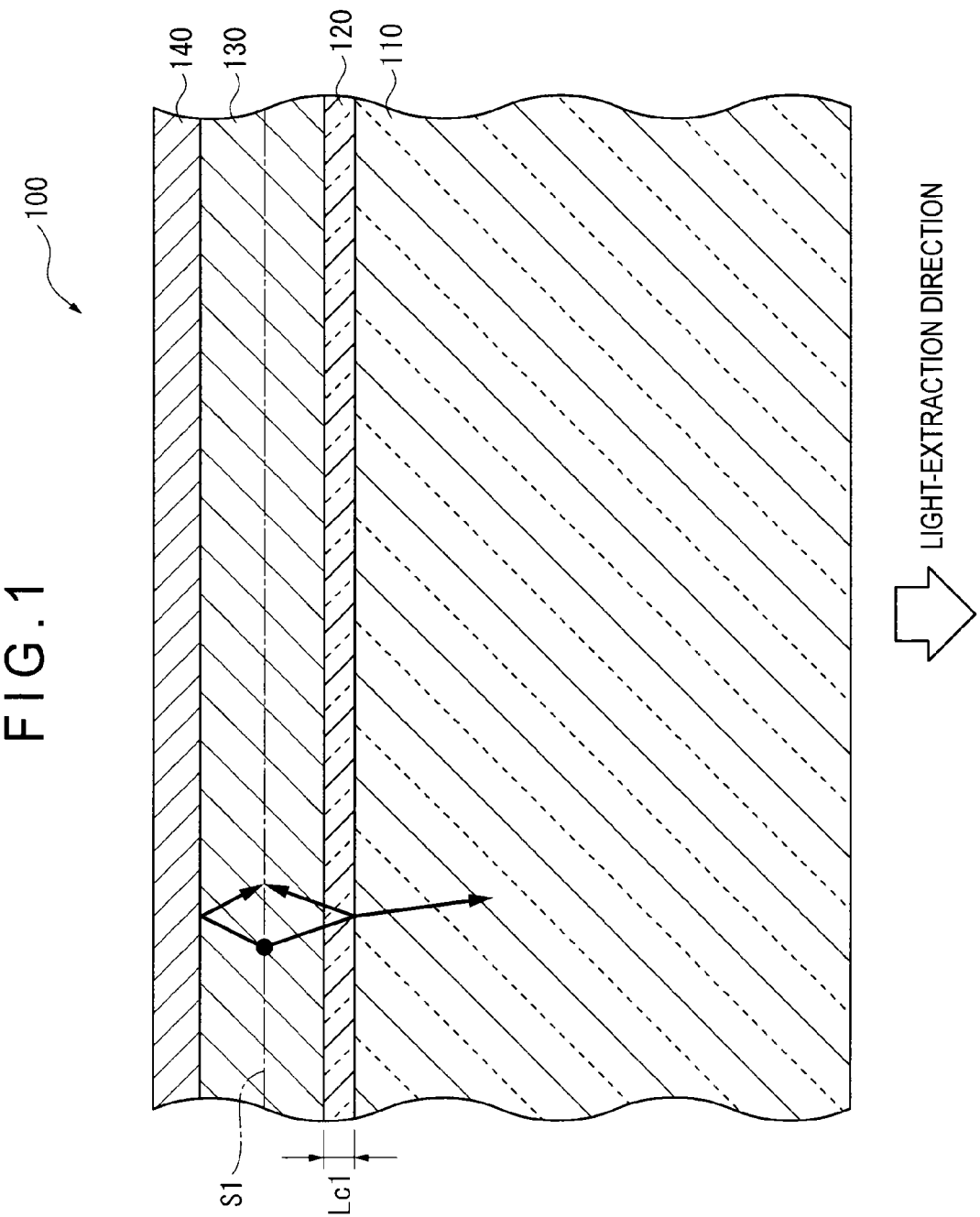

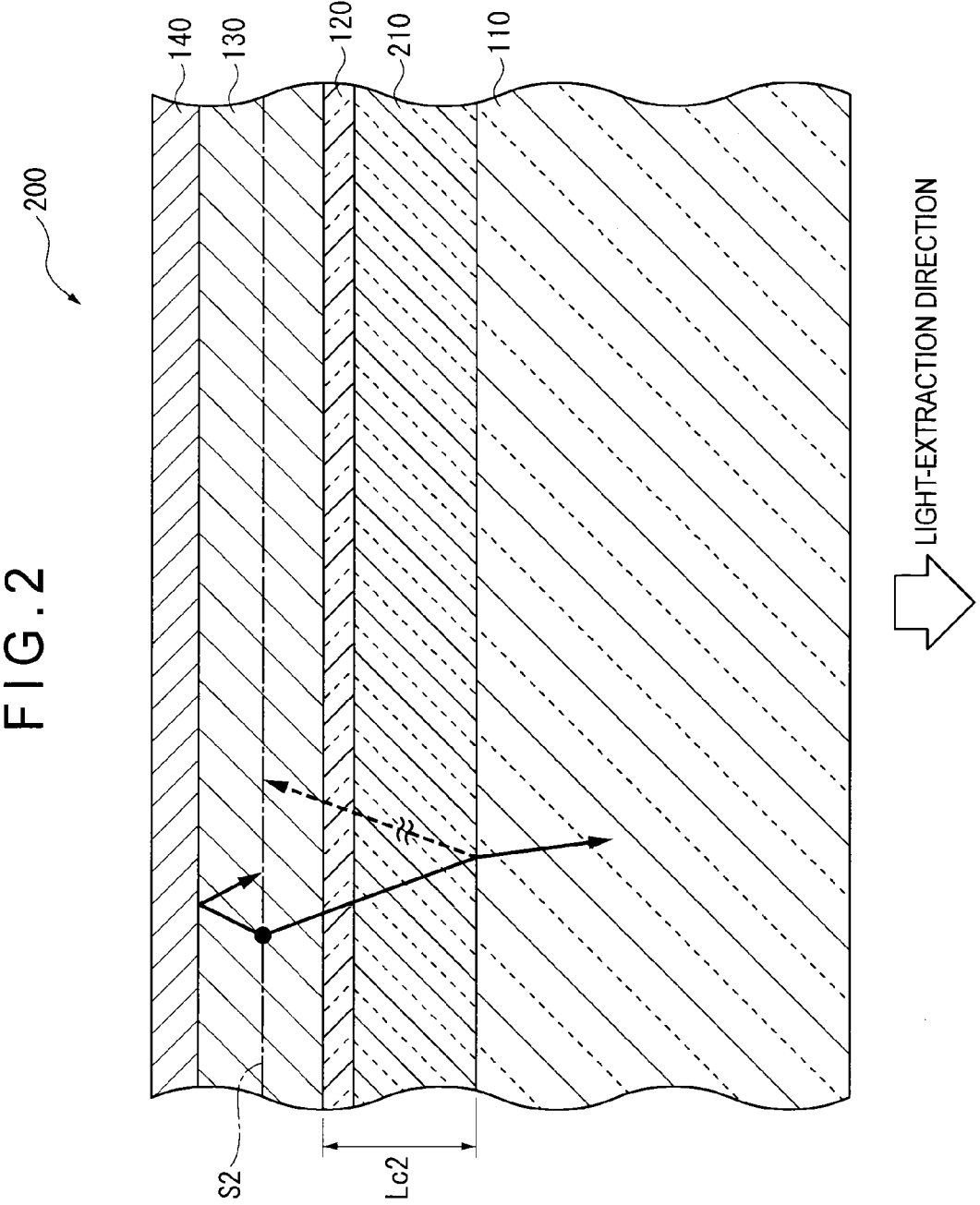

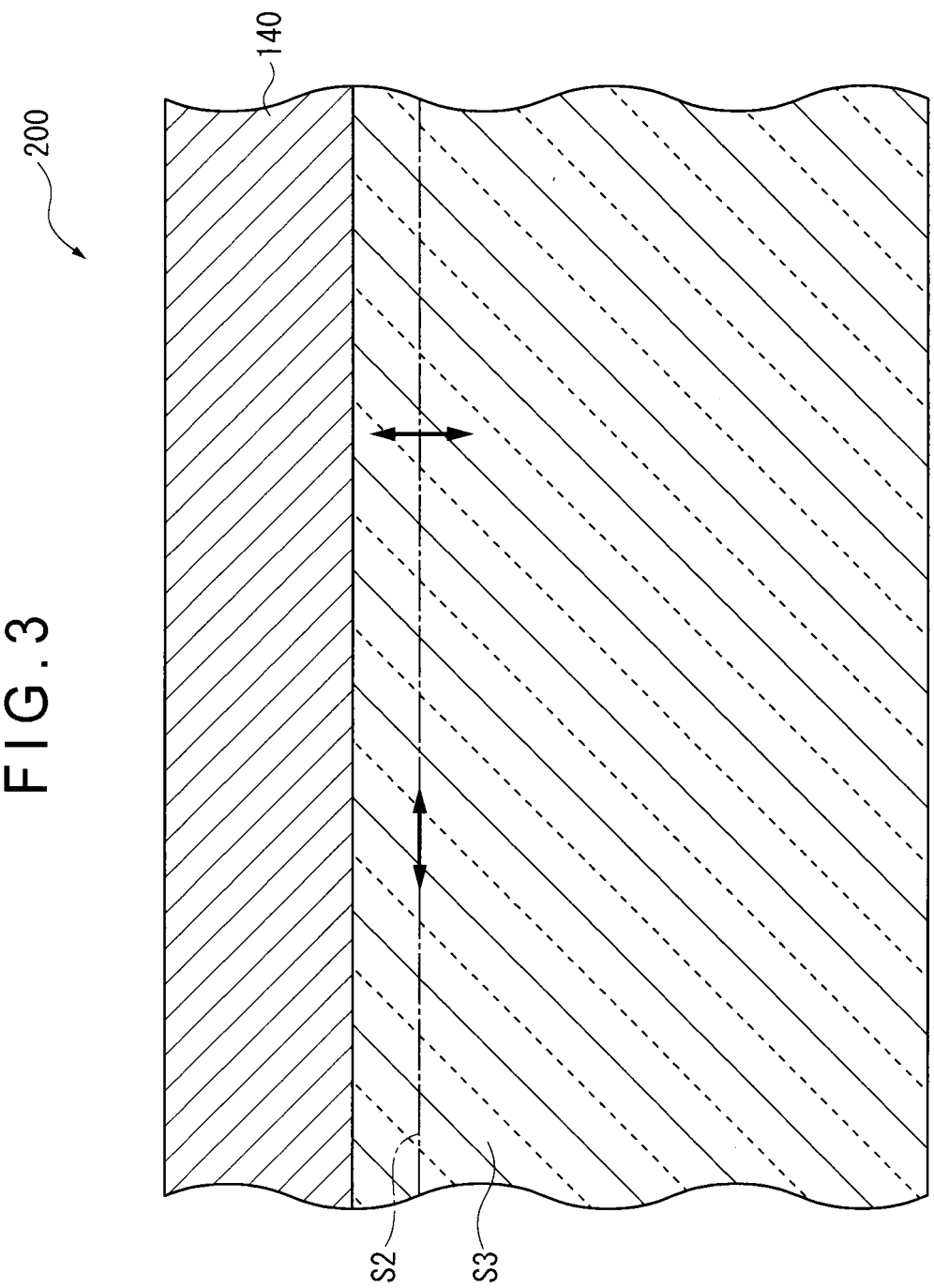

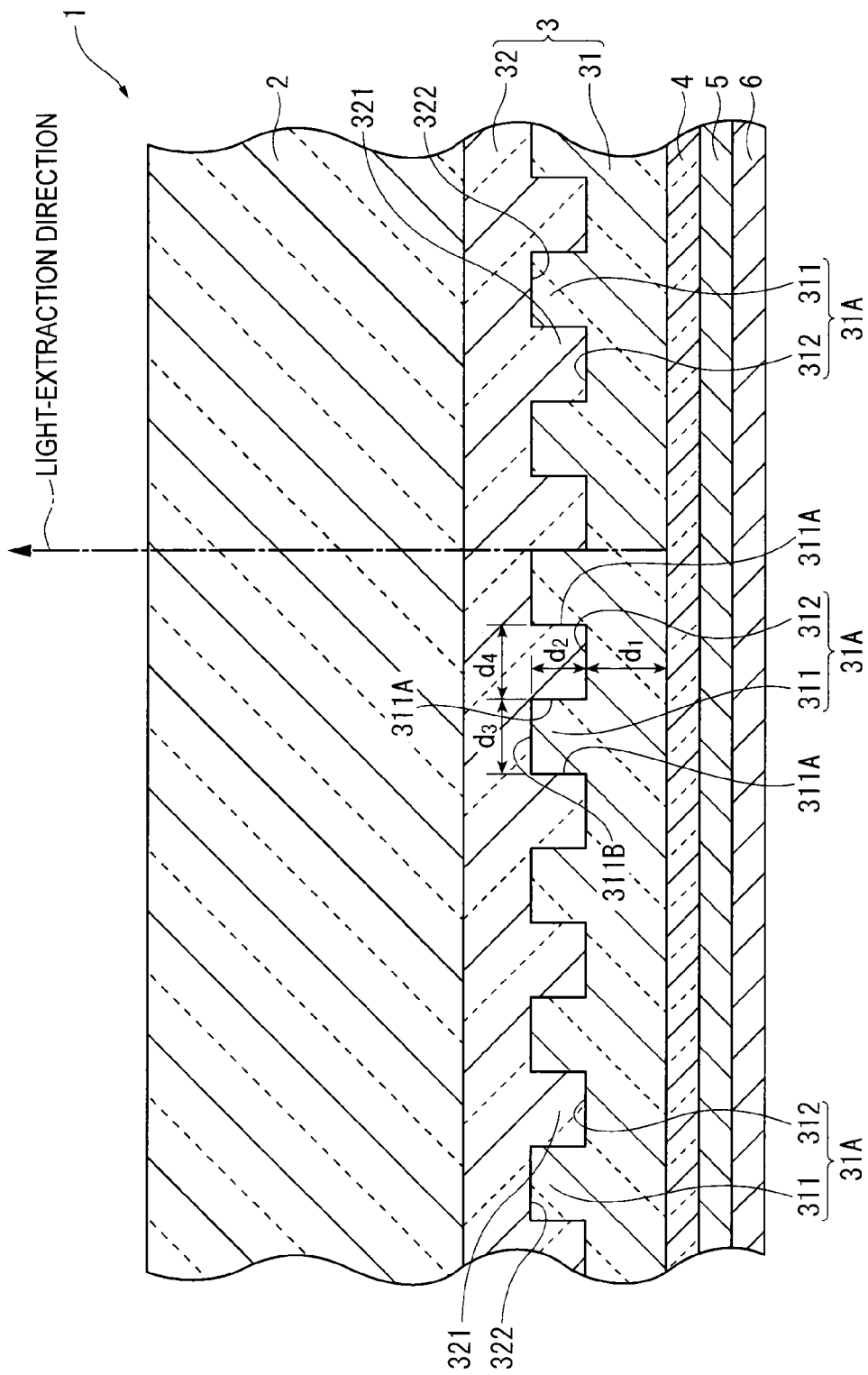

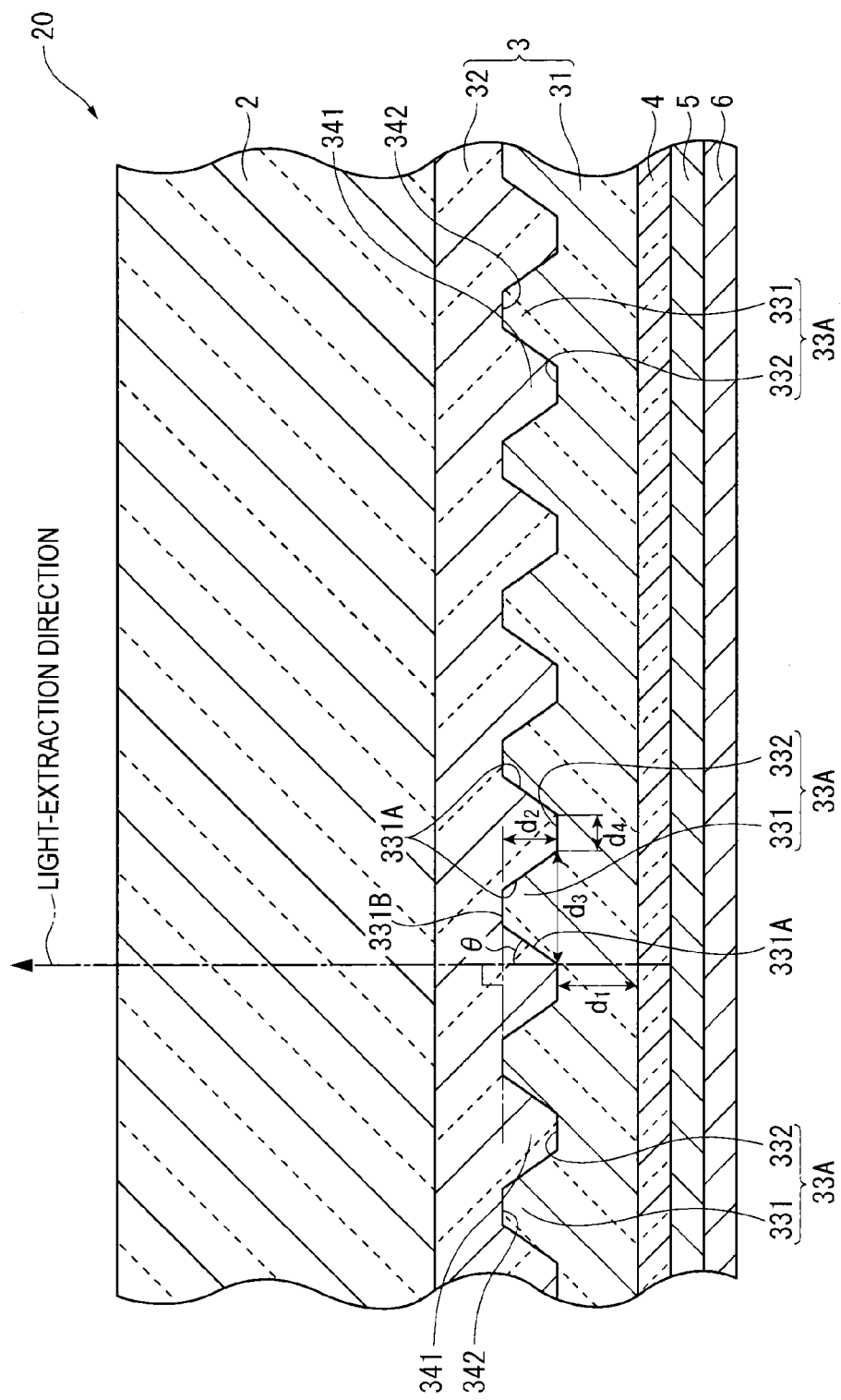

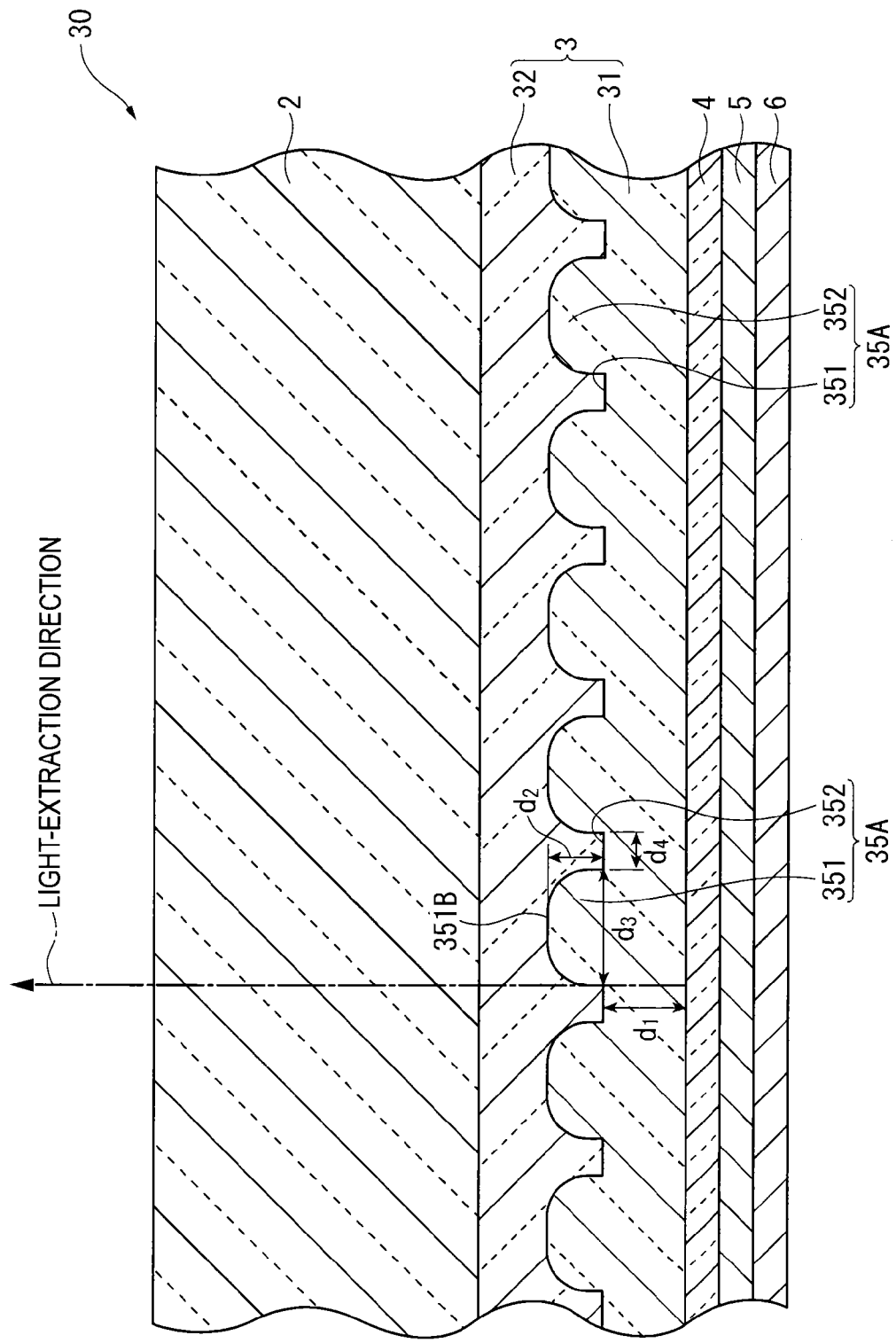

ORGANIC ELECTROLUMINESCENT ELEMENT AND LIGHTING DEVICE

TECHNICAL FIELD

The present invention relates to an organic electroluminescence device and an illumination unit.

BACKGROUND ART

An organic electroluminescence device including an organic thin-film layer (in which an emitting layer is included) between an anode and a cathode, has been known to emit light using exciton energy generated by a recombination at the organic thin-film layer of holes injected from the anode into the emitting layer and electrons injected from the cathode into the emitting layer.

Such an organic electroluminescence device, which has the advantages as a self-emitting device, is expected to serve as an emitting device excellent in luminous efficiency, image quality, power consumption and thin design.

In an optical design of such an organic electroluminescence device, an optical coherence length is adjusted in order to enhance luminous efficiency. By adjusting a thickness of organic layers such as a hole transporting layer, the luminous efficiency can be effectively enhanced and luminous spectrum can be modulated. Thus, adjustment of the optical coherence length is requisite in designing a device.

However, the light trapped within the device cannot be extracted only by adjusting the optical coherence length. Thus, a device that has an arrangement for efficiently extracting the light trapped within the device to drastically enhance the luminous efficiency has been proposed.

A loss of light in a device arrangement for extracting the light in a direction in which a light-transmissive support base (light-transmissive body) for supporting an organic thin-film layer is located is roughly classified into the following modes.

(i) a mode of light trapped in the light-transmissive body by a total reflection at an interface between the light-transmissive body and air (substrate mode)

(ii) a mode of light trapped in a transparent electrode and an organic layer by a total reflection at an interface between the transparent electrode and the light-transmissive body (thin-film mode)

(iii) a mode of light absorbed by a metal electrode as a surface plasmon (surface plasmon mode)

These lossy modes account for several tens of percents to nearly one hundred percents of a total luminous energy in the organic emitting layer depending on the conditions of luminous molecules in the organic emitting layer. Accordingly, it is necessary to develop a mechanism for extracting light of these lossy modes to an outside in order to develop an organic electroluminescence device that emits at a high efficiency.

All of the entrapments of the light according to the substrate mode, the thin-film mode and the surface plasmon mode occur because the light radiated at the emitting layer is trapped within the device as evanescent light.

Various methods for extracting the light trapped within the device as evanescent light have been reported.

In order to extract the light in the substrate mode, it is proposed to provide a convexo-concave structure such as light-scattering particles and microlenses on a surface of a light-transmissive support base. For instance, in Patent Literature 1, an electrode, an electroluminescence layer and a light-transmissive body are layered in this order and layer having a light-scattering function is provided on a light-extraction surface of the light-transmissive body. By providing light-scattering particles at an interface between the light-transmissive body and air, the light in the substrate mode is extracted. Alternatively, in an embodiment, a device arrangement in which a scattering layer and the like for changing the direction of the light to restrain the total reflection is provided within the light-transmissive body is also proposed.

In order to extract the light in the thin-film mode, a device structure in which a light-scattering layer is provided between a light-transmissive body and a transparent electrode layer is proposed. The light-scattering layer is provided by dispersing high refractive index particles of titania and the like having a particle size of several tens of nanometers to several tens of micrometers in a binder resin, by a porous silica layer or by various new light-scattering materials.

For instance, in Patent Literature 2, an electrode, an electroluminescence layer, a high refractive index transparent electrode layer and a light-transmissive body are layered in this order and a scattering layer for evanescent light is provided on respective light-extraction surfaces of the high refractive index transparent electrode layer and the light-transmissive body. The scattering layer for evanescent light is a layer containing particles for scattering the light in a matrix of a low refractive index material. The scattering layer for evanescent light has a light-scattering function for the evanescent light and extracts the light in the thin-film mode. The "light-scattering function" means a multiply scattering light rays by Mie scattering, which is specifically defined as scattering a waveguide light traveling inside an organic thin-film layer in a light-extracting direction. Incidentally, the method used in Patent Literature 2 provides poor flatness of the interface between the light-extraction layer and the transparent electrode. Accordingly, a method for providing an organic electroluminescence device with more reliability and higher light-extraction efficiency is demanded.

In Patent Literature 3, a method in which a convexo-concave structure such as a microlens is interposed between a light-transmissive electrode and a light-transmissive substrate to restrain a total reflection of light is proposed.

Further, a method for enhancing the light-extraction efficiency by providing a diffraction grating having a minute (e.g. submicron order) periodic structure or a photonic crystal to control dispersion relationship (a relationship between energy and wavenumber) of light has been vigorously studied. For instance, in Patent Literature 4 or 5, organic electroluminescence devices having a diffraction grating portion with a periodicity of approximately submicron order between light-transmissive substrate and a first electrode are proposed. The diffraction grating provided in these organic electroluminescence devices allows extraction of the light trapped as evanescent light (light in thin-film mode).

CITATION LIST

Patent Literatures

Patent Literature 1: JP-A-8-83688
Patent Literature 2: Japanese Patent No. 4140541
Patent Literature 3: Japanese Patent No. 4073510
Patent Literature 4: Japanese Patent No. 4253302
Patent Literature 5: Japanese Patent No. 4386285

SUMMARY OF INVENTION

Problems to be Solved by the Invention

The light-extraction efficiency could not be sufficiently enhanced even by using the techniques disclosed in Patent Literatures 1 to 5.

Especially, the light of the thin-film mode and the light of the surface plasmon mode that are trapped within the transparent electrode and the organic layer could not be efficiently extracted according to the method disclosed in Patent Literature 1.

Further, white light is dispersed by the diffraction grating having a periodicity of approximately submicron order in the techniques disclosed in Patent Literatures 4 and 5, so that the techniques are not suitably applicable to an emitting device used especially for a light source of an illumination unit.

An object of the invention is to provide an organic electroluminescence device that exhibits a high light-extraction efficiency and thus is suitable for a light source of an illumination unit. Especially, an object of the invention is to provide an organic electroluminescence device that is adapted to regulate an optical loss of the thin-film mode and the surface plasmon mode and is adapted to improve an external quantum efficiency by efficiently extracting the light of the thin-film mode, so that favorable white emission with small diffractiveness can be obtained.

A further object of the invention is to provide an illumination unit provided with the above organic electroluminescence device.

Means for Solving the Problems

After vigorous study on a measure for efficiently extracting light generated in an emitting layer but trapped in an organic electroluminescence device, the inventors have found that a predetermined convexo-concave shape provided at an interface between a transparent electrode and a transparent substrate restrains a total reflection at the interface and evanescent light to be generated by the total reflection can be efficiently extracted to an outside of the device. The invention has been made based on the above findings.

An organic electroluminescence device according to an aspect of the invention includes: a transparent electrode; an opposing electrode; an organic emitting layer provided between the transparent electrode and the opposing electrode; and a light-transmissive substrate, in which a light-extraction layer is provided adjacent to a first side of the transparent electrode opposite to a second side of the transparent electrode facing the organic emitting layer, the light-extraction layer comprises a high refractive index layer and a low refractive index layer sequentially layered on the transparent electrode, the light-transmissive substrate is provided adjacent to the low refractive index layer, when a cross section of the organic electroluminescence device in a thickness direction is observed with the light-extraction layer being placed above the opposing electrode, the high refractive index layer comprises a plurality of recess-protrusion units each provided by a protrusion and a recess at an interface between the high refractive index layer and the low refractive index layer, and in at least one of the plurality of recess-protrusion units, a distance d1 from the interface between the high refractive index layer and the low refractive index layer to an interface between the transparent electrode and the high refractive index layer is equal to or more than an optical coherence length, and a height d2 of the protrusion, a width d3 of the protrusion and a gap d4 between the protrusion and another protrusion adjoining with the protrusion across the recess are 1 μm or more.

According to the above aspect of the invention, in the organic electroluminescence device of which light is extracted from the side of the light-transmissive substrate, the high refractive index layer of which thickness is equal to or more than the optical coherence length is provided between the transparent electrode and the light-transmissive substrate, so that a ratio of light to be coupled to the surface plasmon mode is decreased while a ratio of light to be coupled to the thin-film mode is increased. Conventionally, since it is not considered to provide a high refractive index layer at the position, the ratio of light to be coupled to the surface plasmon mode is large, so that the effect of the light-extraction structure is limited.

According to the arrangement of the invention, since a convexo-concave structure provided by a high refractive index material and a low refractive index material is provided in order to extract light from the thin-film mode with enhanced coupling efficiency, the light-extraction efficiency can be effectively improved. In other words, since the light-extraction layer provided by laminating a high refractive index layer and a low refractive index layer on a transparent electrode in this order is provided adjacent to the transparent electrode and the recess-protrusion unit is provided at the interface between the high refractive index layer and the low refractive index layer, the light of the thin-film mode incident on the high refractive index layer at an angle of the critical angle or more does not totally reflect at the interface but is transmitted to the low refractive index layer. In consequence, the light is extracted to the outside via the light-transmissive substrate.

Thus, the light-extraction efficiency of the radiation light generated in the organic emitting layer can be enhanced.

Further, since the height $d_2$ and the width $d_3$ of the protrusions and the gap $d_4$ between the protrusions are sufficiently larger than the wavelength in the visible light region, the white light is not likely to be dispersed unlike when using a diffraction grating having a periodicity and a protrusion height of approximately submicron order. Accordingly, the organic electroluminescence device according to the above aspect of the invention provides a favorable white emission with a small diffractiveness and is suitable for a light source of an illumination unit. Conventionally, since a convexo-concave structure of approximately submicron order is used, the light is diffracted simultaneously with being extracted. When white emission is to be extracted with the use of conventional technique, since the light-extraction efficiency of a light of only a part of the wavelength of the white light is enhanced and the light-extraction efficiency changes depending on the radiation angle, coloration changes depending on the angle at which the emitting device is seen. As described above, the invention does not significantly exhibit the above disadvantages even to a radiation light including various emission wavelengths (e.g. white light) and enhances the light-extraction efficiency.

Explanation will be given below on a sectioned position when an organic electroluminescence device is seen in cross section in a thickness direction of a substrate. In the invention, a cross section obtained by cutting an organic electroluminescence device along a crosscutting line passing through at least two adjoining recess-protrusion units in plan view of the recess-protrusion unit is observed. The direction and positional condition of the crosscutting line can be defined in a variety of ways. However, it is only necessary for the invention that the dimension of the light-extraction layer and the recess-protrusion unit defined by the optical coherence length is satisfied when a cross section is cut out in one direction and positional relationship.

Next, the adjustment of the optical coherence length will be described. The adjustment of the optical coherence length is usually conducted in designing a device. However, when considering emission characteristics of a device starting from phenomenon occurring in a near-field light region or a dipole radiation theory, most of the light-extraction structures proposed so far can be deemed as one separate from the emission mechanism within the device.

When a layer having a light-extraction function is inserted inside a device, since an optical mode inherent to the device changes, the most appropriate optical device cannot be designed without considering the change in the optical mode. Thus, after analyzing how a dipole radiation couples with the thin-film mode or the surface plasmon mode, the above light-extraction structure for reducing the coupling efficiency to the surface plasmon mode is provided in the invention, thereby enhancing the external quantum efficiency.

Further, since the light coupled to the surface plasmon mode is restrained, the coupling efficiency to the thin-film mode is mainly enhanced. The external quantum efficiency can thus be enhanced by providing the above light-extraction structure for improving the light-extraction efficiency from the thin-film mode.

Further, with the above light-extraction structure provided by a nondiffracting periodic structure, the radiation light generated in the organic emitting layer of an illumination unit can be extracted to the outside without being dispersed.

Incidentally, the optical coherence length in the invention is defined as: (optical coherence length)=$\lambda^2/\{n_H(\Delta\lambda)\}$. Here, $\lambda$ is a peak wavelength of an emission spectrum of a radiation light generated in an organic emitting layer. $\Delta\lambda$ is a half bandwidth of the emission spectrum. $n_H$ is a refractive index of a high refractive index layer.

Further, since the height $d_2$ and the width $d_3$ of the nondiffracting and periodically-structured protrusions and the gap $d_4$ between the protrusions have to be sufficiently larger than the wavelength in the visible light region, the height $d_2$, the width $d_3$ and the gap $d_4$ are usually required to be 1 µm or more, preferably, 5 µm or more and further preferably 20 µm or more. Incidentally, in order to efficiently extract the light in the film mode, the height $d_2$ and the width $d_3$ of the protrusion and the gap $d_4$ between the protrusions are preferably 1 mm or less.

Device Design According to Analysis of Photonic Mode Density

Here, how the dipole radiation is coupled to the thin-film mode or the surface plasmon mode will be described based on an analysis result of a photonic mode density. The details of the dipole radiation theory are described in a reference document (Adv. Chem. Phys. 37 (1973) pp. 1-65).

Device Structure A1

FIG. 1 shows an arrangement of a typical bottom-emission organic electroluminescence device 100 as a device structure A1. The organic electroluminescence device 100 includes a light-transmissive substrate 110 made of glass, a light-transmissive electrode 120 made of ITO (Indium Tin Oxide), an organic layer 130 and an opposing electrode 140 made of Ag (silver) in this order. Incidentally, the organic layer 130 includes a hole injecting layer, a hole transporting layer, an emitting layer and an electron transporting layer in this order from the light-transmissive electrode 120 (the layer structure of the organic layer 130 is not illustrated). In the organic layer 130 in FIG. 1, a recombination region S1 at which holes and electrons are recombined is illustrated in a dashed line and an optical path of a radiation light generated in the emitting layer of the organic layer 130 from the recombination region S1 is illustrated in arrows. A thickness Lc1 of the light-transmissive electrode 120 is less than the optical coherence length.

In the organic electroluminescence device 100, a wavenumber expansion form of the dipole radiation energy when luminous molecules in the organic layer 130 are assumed as electrical dipole moments is calculated. Based on the results of the calculation, a coupling efficiency to each mode when the luminous molecules are randomly oriented is estimated. The coupling efficiencies are shown in Table 1.

TABLE 1

|  | Device Structure A1 | | | Device Structure A2 | | |
| --- | --- | --- | --- | --- | --- | --- |
|  | Parallel | Vertical | Random | Parallel | Vertical | Random |
| Emission mode | 0.36 | 0.01 | 0.24 | 0.32 | 0.02 | 0.22 |
| Substrate mode | 0.29 | 0.11 | 0.23 | 0.32 | 0.15 | 0.26 |
| Thin-film mode | 0.16 | 0.03 | 0.11 | 0.16 | 0.25 | 0.19 |
| SPPs mode | 0.20 | 0.84 | 0.41 | 0.20 | 0.58 | 0.33 |

SPPs mode: surface plasmon polaritons mode

Device Structure A2

FIG. 2 shows an arrangement of a bottom-emission organic electroluminescence device 200 having a thick high refractive index layer as a device structure A2. The organic electroluminescence device 200 has a structure similar to the organic electroluminescence device 100 except that a high refractive index layer 210 having a thickness sufficiently larger than the optical coherence length is provided between the light-transmissive substrate 110 and the light-transmissive electrode 120 of the organic electroluminescence device 100. In the organic layer 130 in FIG. 2, a recombination region S2 at which holes and electrons are recombined is illustrated in a dashed line and an optical path of a radiation light generated in the emitting layer of the organic layer 130 from the recombination region S2 is illustrated in arrows. A total thickness Lc2 of the light-transmissive electrode 120 and the high refractive index layer 210 is equal to or more than the optical coherence length.

The refractive index of the high refractive index layer 210 is larger than the refractive index of the light-transmissive substrate 110 and is equal to or less than the refractive index of the organic layer 130. Since the organic electroluminescence device 200 includes the high refractive index layer 210 of an optically sufficient thickness (i.e. thicker than a coherence length), the oscillation of the electrical dipole moment is less likely to be influenced by reflection of electric and magnetic fields from the interface between the light-transmissive substrate 110 and the high refractive index layer 210. In other words, the organic electroluminescence device 200 having an optical arrangement as in the device structure A2 is less likely to be influenced by a perturbation of reflection light. On the other hand, according to the optical arrangement in device structure A1, the oscillation of the electrical dipole moment is influenced by a perturbation of reflection light. Accordingly, the optical arrangement of the device structure A2 can be approximated as a semi-infinite region S3 in which the emitting layer, the light-transmissive electrode and the high refractive index layer are combined as shown in FIG. 3. The arrows in FIG. 3 show parallel and vertical directions of the dipole radiation in the recombination region S2.

In the optical arrangement shown in FIG. 3, the wavenumber expansion form of the dipole radiation energy in which the luminous molecules in the emitting layer 130 are assumed as electrical dipole moments is calculated in the same manner as the organic electroluminescence device 100. Based on the results of the calculation, the coupling efficiencies to the respective modes in which the luminous molecules are randomly oriented are evaluated. The coupling efficiencies are shown in Table 1.

As shown in Table 1, it can be observed that, while the coupling efficiency to the surface plasmon mode (SPPs mode: Surface plasmon Polaritons mode) is reduced, the light is coupled to other mode such as the thin-film mode in the device structure A2. Incidentally, the surface plasmon mode refers to a phenomenon in which luminous energy is absorbed in a metal electrode. Accordingly, extracting the light from the surface plasmon mode is more difficult than light-extraction in the other optical modes.

As described above, the device structure A2 having the high refractive index layer 210 between the light-transmissive substrate 110 and the light-transmissive electrode 120 reduces the light coupled to the surface plasmon mode and enhances the coupling efficiency to the thin-film mode. Further, by providing the low refractive index layer between the high refractive index layer and the light-transmissive substrate and by providing the plurality of recess-protrusion units provided by protrusions and recesses at the interface between the high refractive index layer and the low refractive index layer, the light of the thin-film mode with enhanced coupling efficiency can be efficiently extracted. Consequently, the external quantum efficiency can be enhanced.

In the organic electroluminescence device of the above aspect of the invention, it is preferable that the following formulae (1), (2) and (3) are satisfied, where $n_1$ represents a refractive index of the transparent electrode, $n_L$ represents a refractive index of the low refractive index layer, $n_H$ represents a refractive index of the high refractive index layer and $n_2$ represents a refractive index of the light-transmissive substrate. Incidentally, the refractive indexes $n_1$, $n_L$, $n_H$ and $n_2$ represent values at a wavelength of 550 nm.

Formula 1

$$|n_1 - n_H| < 0.2 \quad (1)$$

$$|n_2 - n_L| < 0.2 \quad (2)$$

$$n_H > n_L \quad (3)$$

According to the above arrangement, since the refractive indexes satisfy the relationship defined by the formulae (1) to (3), the light of the thin-film mode is efficiently guided to the interface between the high refractive index layer and the low refractive index layer. Further, the total reflection of the light at the interface between the high refractive index layer and the low refractive index layer is restrained.

The refractive indexes of the transparent electrode and the high refractive index layer are preferably approximately the same. Similarly, the refractive indexes of the light-transmissive substrate and the low refractive index layer are preferably approximately the same. When the difference between the above refractive indexes exceeds 0.2, the reflectivity at the interface is increased, which results in significant increase in the light in the lossy mode.

Thus, the light-extraction efficiency of the radiation light generated at the organic emitting layer can be further enhanced by satisfying the relational expressions (1) to (3).

In the organic electroluminescence device of the above aspect of the invention, it is preferable that the height $d_2$ of the protrusion and the width $d_3$ of the protrusion satisfy a relationship of $2.0 > d_2/d_3 > 0.2$.

According to the above arrangement, since the light transmitted to the recess-protrusion unit at the interface between the high refractive index layer and the low refractive index layer can be further efficiently transmitted to the low refractive index layer, the light-extraction efficiency can be further enhanced. When $d_2/d_3$ is larger than 2.0 (i.e. when the aspect ratio becomes large) in a close-packed structure, the light refracted at the protrusion side face is likely to enter again to the adjacent protrusion to cause a multiple reflection and the like, so that the light-extraction efficiency may be reduced. In order to obtain a uniform surface emission, the close-packed structure or an arrangement with similar filling rate is preferable.

In the organic electroluminescence device of the above aspect of the invention, a side face of the protrusion along a height direction is inclined at 35 degrees or less relative to a light-extraction direction of a light generated by the organic emitting layer.

According to the above aspect, the light totally reflected at the interface between the high refractive index layer and the low refractive index layer can be efficiently extracted.

In the organic electroluminescence device of the above aspect of the invention, it is preferable that the side face of the protrusion of the high refractive index layer has a shape extending along the light-extraction direction of the light generated by the organic emitting layer.

In addition, in the organic electroluminescence device of the above aspect of the invention, it is preferable that an upper face of the protrusion of the high refractive index layer has a shape extending along a direction orthogonal to the light-extraction direction of the light generated by the organic emitting layer.

According to the above arrangements, since the light transmitted to the recess-protrusion unit at the interface between the high refractive index layer and the low refractive index layer can be further efficiently transmitted to the low refractive index layer, the light-extraction efficiency can be further enhanced. Incidentally, when the protrusion side face of the high refractive index layer is formed along the light-extraction direction, the above inclination angle is 0 degree.

In the organic electroluminescence device of the above aspect of the invention, it is preferable that the optical coherence length is 3 μm or more.

According to the above arrangement, the coupling efficiency to the thin-film mode can be efficiently enhanced even for the light with wide half bandwidth of the emission peak.

In the organic electroluminescence device of the above aspect of the invention, it is preferable that the height $d_2$ of the protrusion, the width $d_3$ of the protrusion and the gap $d_4$ between the protrusion and another protrusion adjoining with the protrusion across the recess are 5 μm or more.

When $d_2$ is the optical coherence length or less, it is preferable that $d_3$ and $d_4$ are the optical coherence length or more.

According to the above aspect, the diffraction of white light can be further securely avoided.

In the organic electroluminescence device of the above aspect of the invention, it is preferable that an electron transporting zone having a thickness of 70 nm or more is provided between the opposing electrode and the organic emitting layer.

According to the above arrangement, since the thickness of the electron transporting zone is 70 nm or more, the coupling efficiency of the dipole radiation of the luminous molecules oriented in a parallel direction in the organic emitting layer to the surface plasmon mode is reduced and the coupling efficiency to each of the substrate mode, thin-film mode and emission mode is further enhanced. Since the light of the thin-film mode can be efficiently extracted by the light-extraction layer, the external quantum efficiency of the organic electroluminescence device can be enhanced.

An illumination unit according to another aspect of the invention includes the organic electroluminescence device according to the above aspect of the invention.

Since the organic electroluminescence device according to the above aspect of the invention exhibits a high light-extraction efficiency, an illumination unit with a high luminance can be provided.

BRIEF DESCRIPTION OF DRAWING(S)

FIG. 1 is a cross section in a thickness direction of a device showing a device structure of a bottom-emission organic electroluminescence device.

FIG. 2 is a cross section in a thickness direction of a device showing a device structure of a bottom-emission organic electroluminescence device, where the device is provided with a high refractive index layer.

FIG. 3 is a partial cross section of the device structure shown in FIG. 2, where an optical disposition is approximated.

FIG. 4 is a cross section in a thickness direction of an organic electroluminescence device according to a first exemplary embodiment of the invention.

Figure 5A:
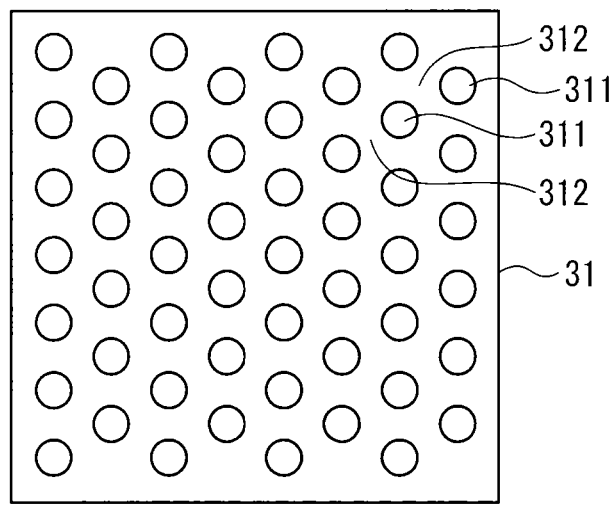
FIG. 5A is a plan view of a high refractive index layer of the organic electroluminescence device according to the above exemplary embodiment seen from a side of a light-transmissive substrate, where an arrangement pattern of projections and recesses is exemplarily illustrated.
Figure 5B:
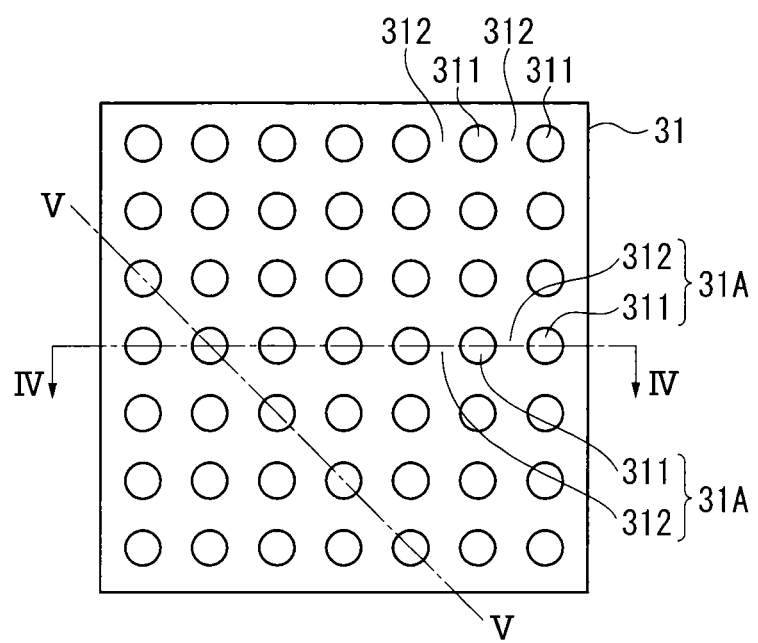
FIG. 5B illustrates an arrangement pattern different from that shown in FIG. 5A.
Figure 5C:
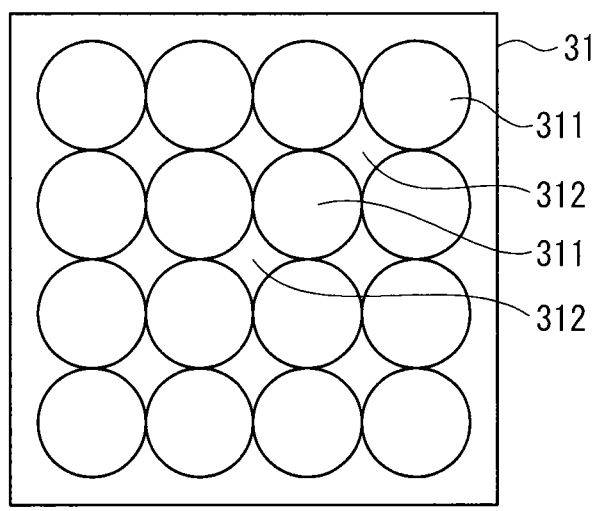

FIG. 5C exemplarily illustrates an arrangement pattern different from those shown in FIGS. 5A and 5B.

Figure 6:
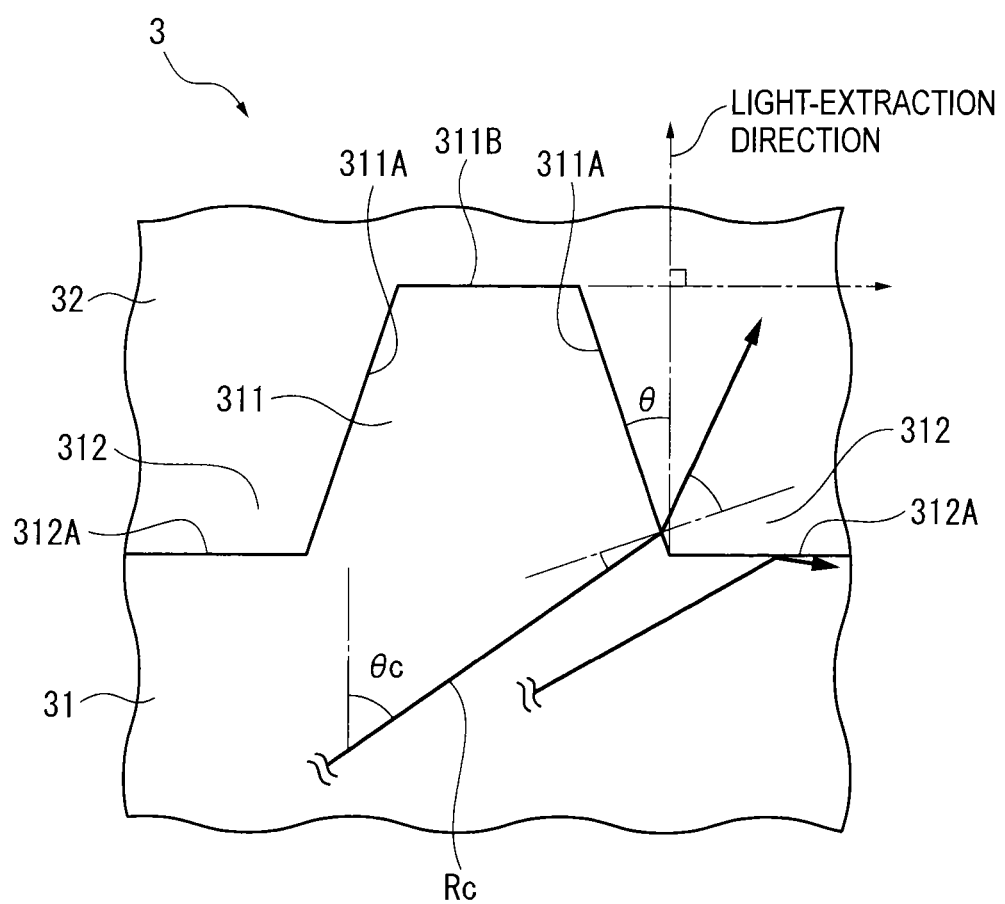

FIG. 6 is a partially enlarged cross section showing an interface between the high refractive index layer and a low refractive index layer of the organic electroluminescence device according to the above exemplary embodiment seen in the same direction as in FIG. 4.

Figure 7:
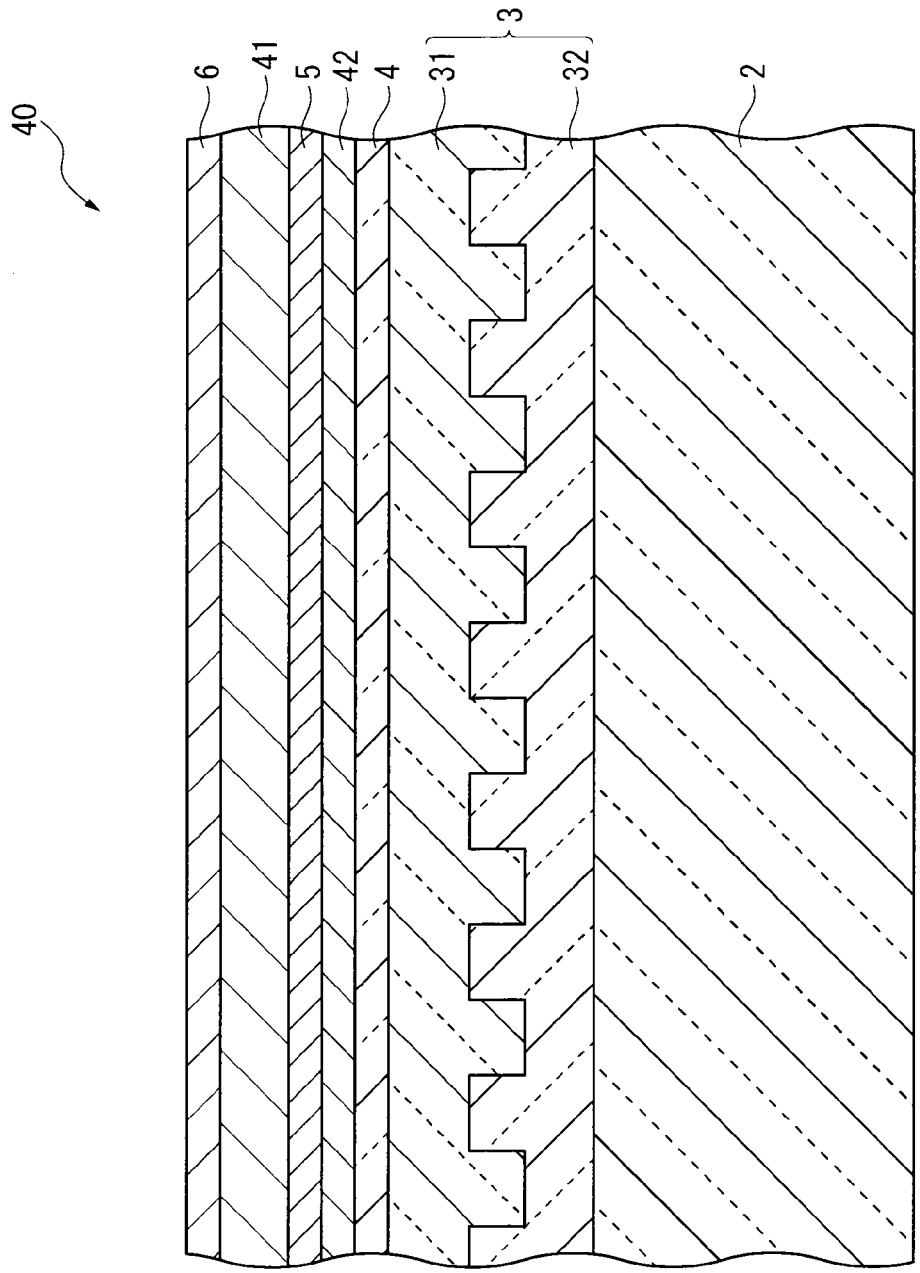

FIG. 7 is a cross section in a thickness direction of an organic electroluminescence device according to a second exemplary embodiment of the invention.

Figure 8:
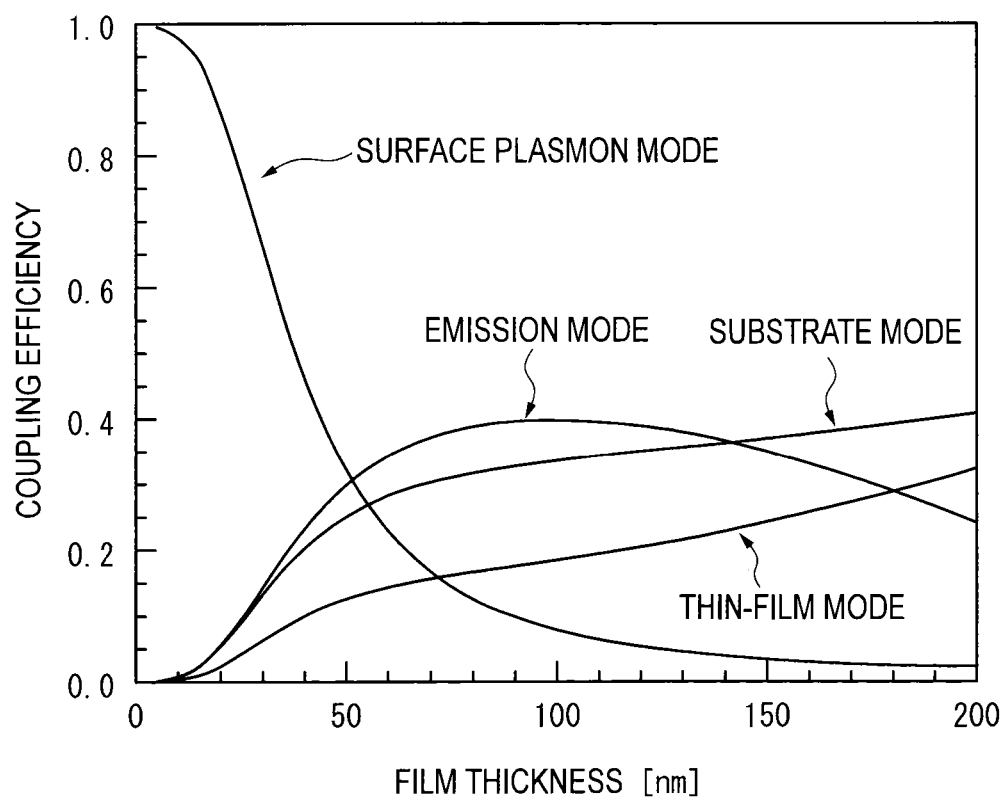

FIG. 8 is a graph showing a result of Photonic mode density analysis of dipole radiation of parallely oriented luminous molecules.

Figure 9:
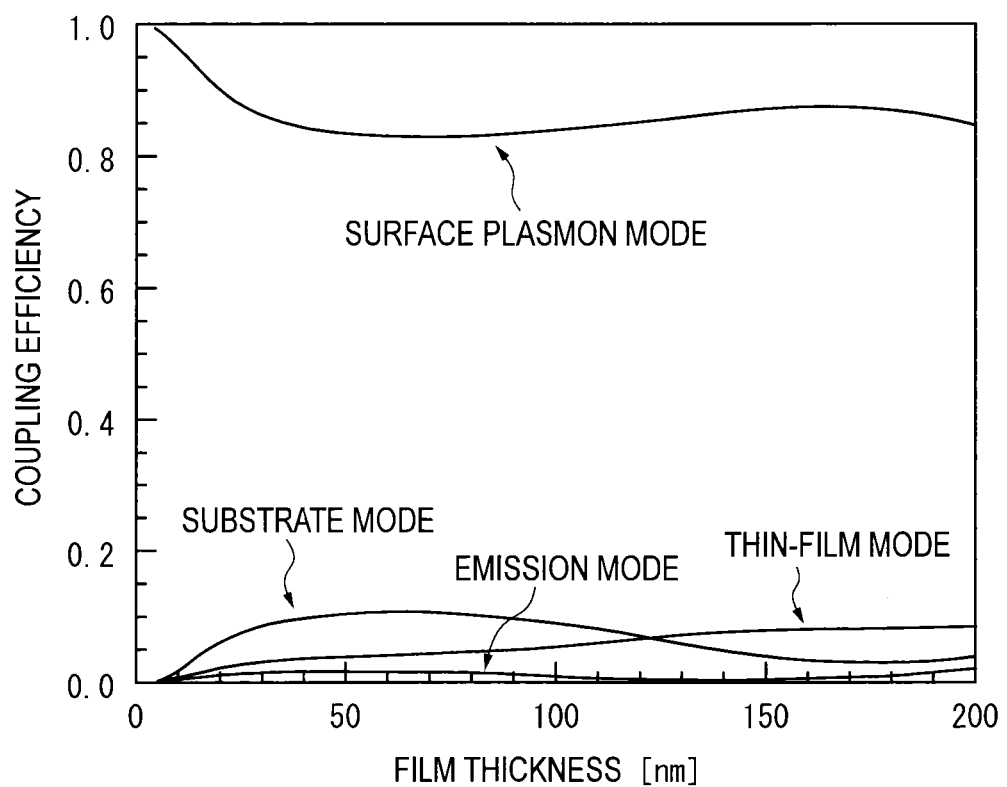

FIG. 9 is a graph showing a result of Photonic mode density analysis of dipole radiation of vertically oriented luminous molecules.

Figure 10:
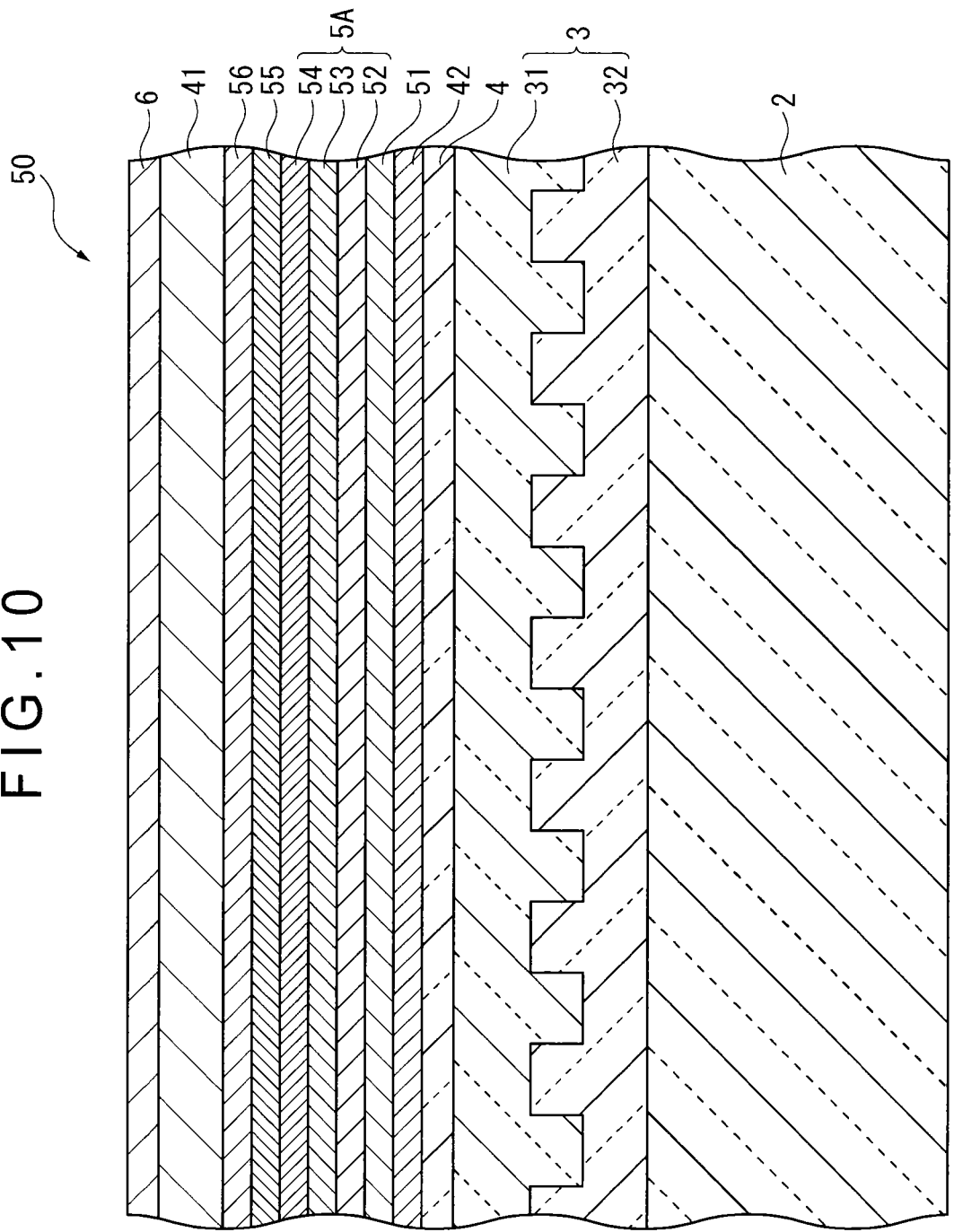

FIG. 10 is a cross section in a thickness direction of an organic electroluminescence device according to a third exemplary embodiment of the invention.

Figure 11A:
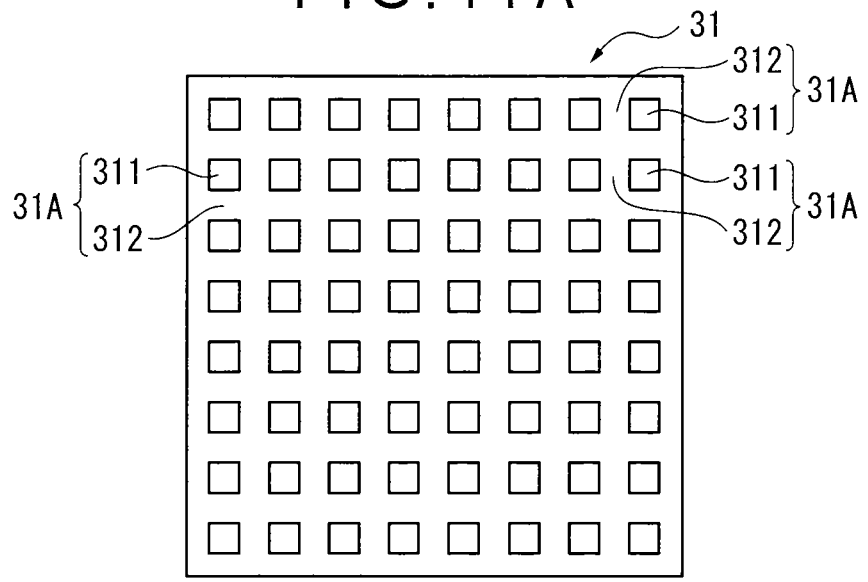

FIG. 11A is a plan view of a high refractive index layer of the organic electroluminescence device according to a modification of the invention seen from a side of a light-transmissive substrate, where an arrangement pattern of projections and recesses is exemplarily illustrated.

Figure 11B:
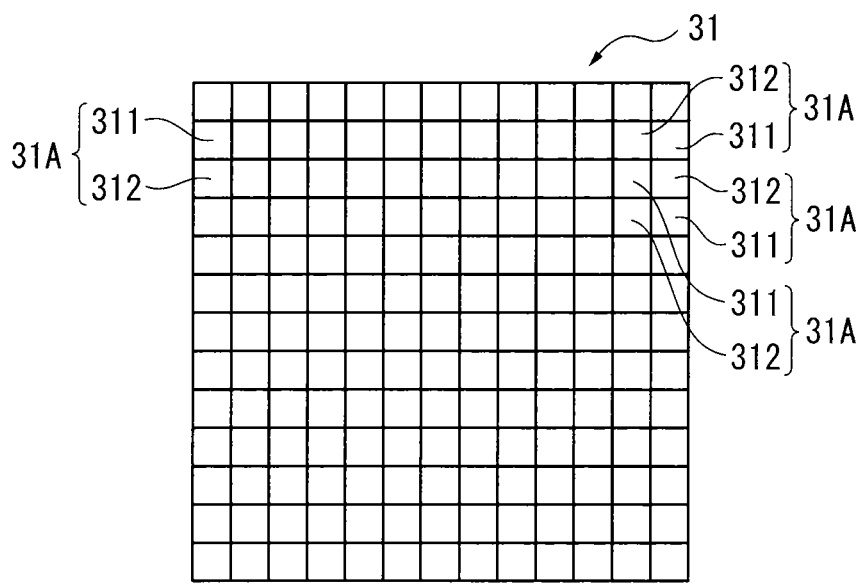

FIG. 11B illustrates an arrangement pattern different from that shown in FIG. 11A.

Figure 11C:
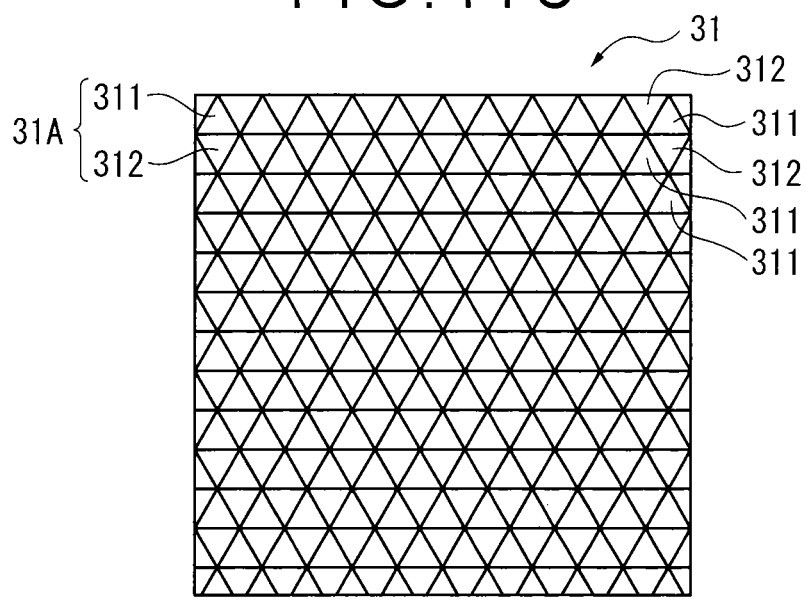

FIG. 11C exemplarily illustrates an arrangement pattern different from those shown in FIGS. 11A and 11B.

FIG. 12 is a cross section in a thickness direction of an organic electroluminescence device according to another modification of the invention.

FIG. 13 is a cross section in a thickness direction of an organic electroluminescence device according to still another modification of the invention.

Figure 14A:
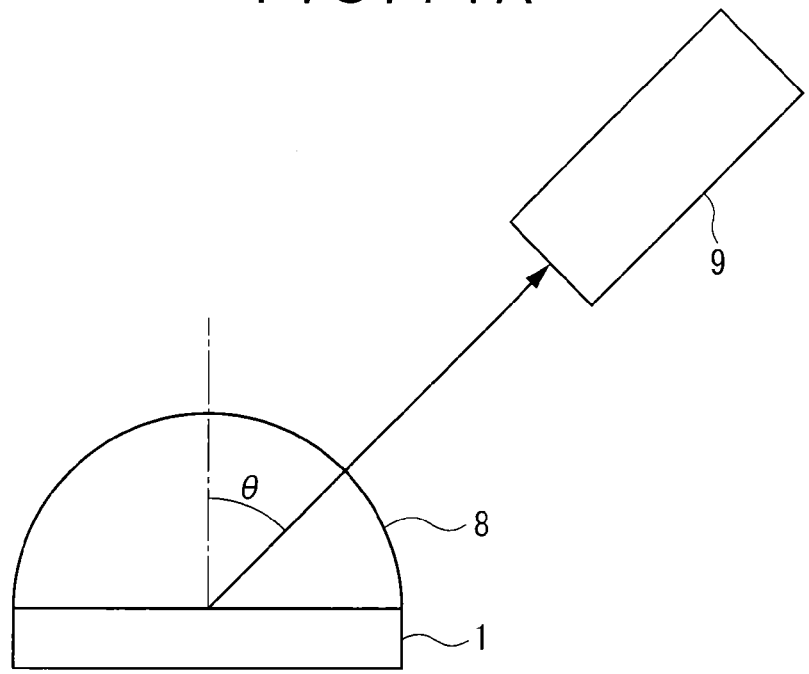

FIG. 14A illustrates a measurement method of EL emission spectrum from an organic electroluminescence device.

Figure 14B:
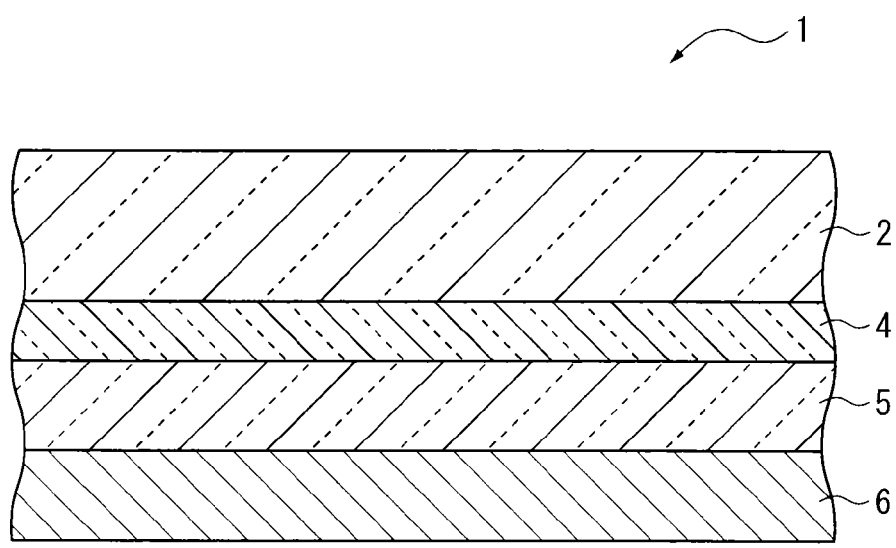

FIG. 14B schematically shows a structure of the organic electroluminescence device shown in FIG. 14A.

Figure 15A:
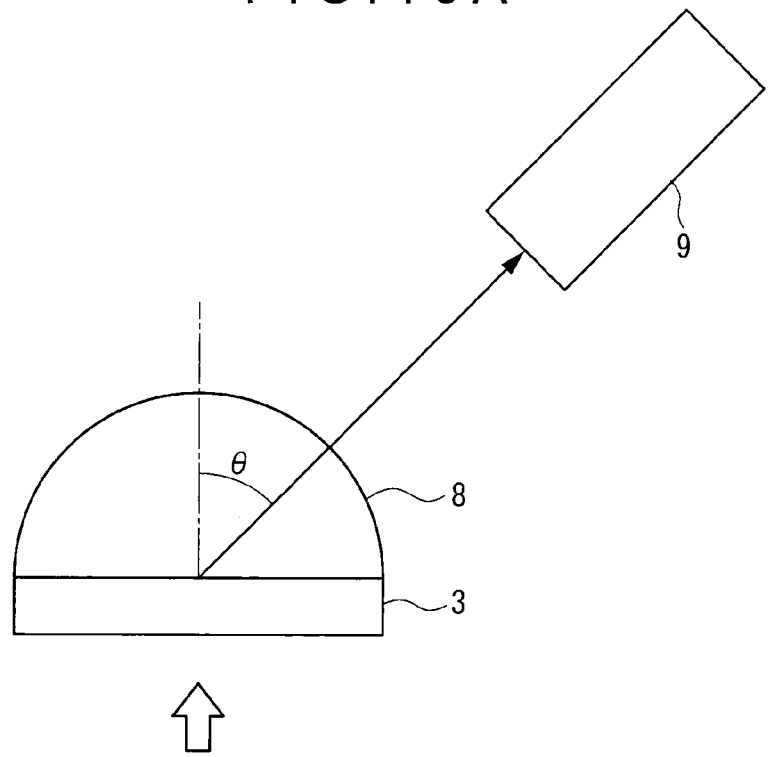

FIG. 15A illustrates a measurement method of scattered diffraction spectrum from a light-extraction layer structure.

Figure 15B:
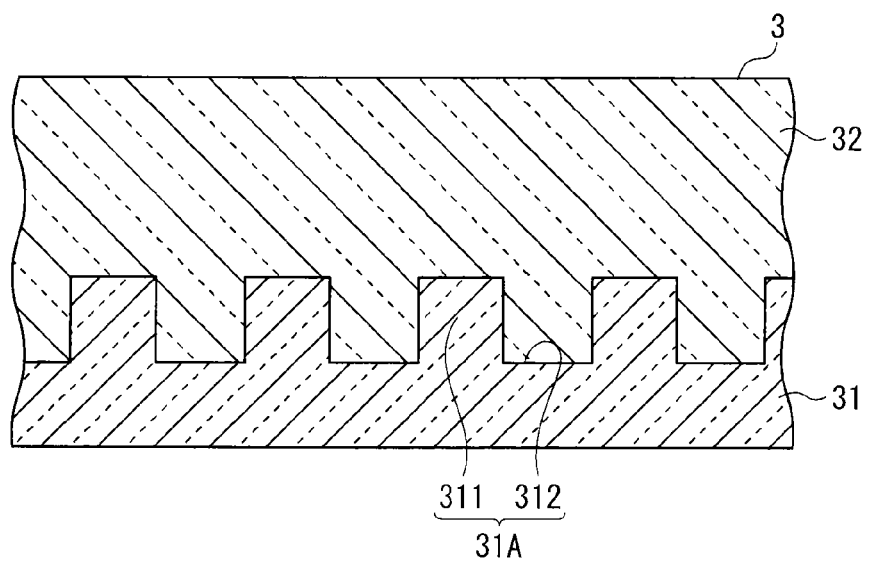

FIG. 15B schematically shows a light-extraction layer structure in FIG. 15A.

Figure 16A:
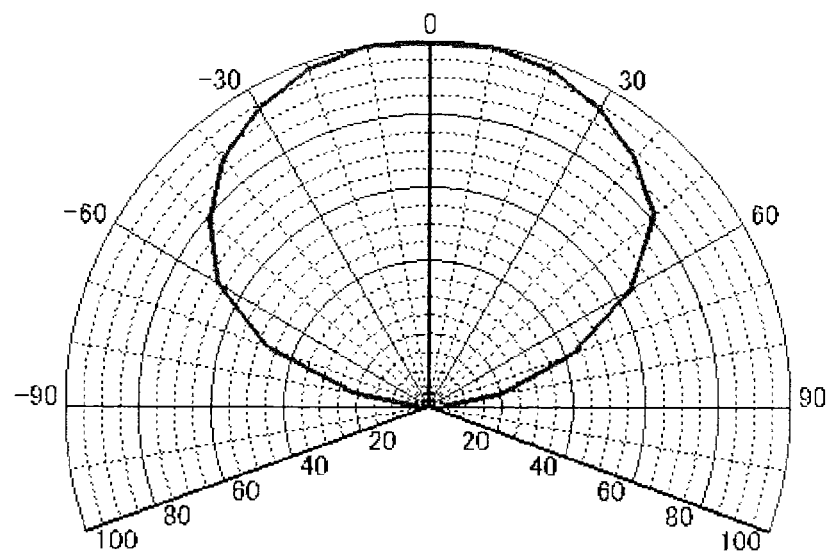

FIG. 16A illustrates a radiation pattern of an organic EL device according to an example.

Figure 16B:
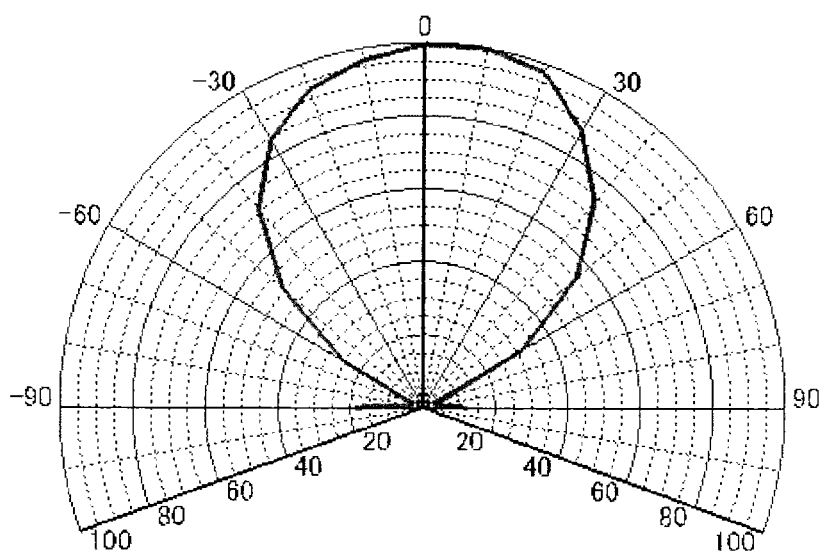

FIG. 16B illustrates a radiation pattern of an organic EL device according to a comparative example.

DESCRIPTION OF EMBODIMENT(S)

First Exemplary Embodiment

A first exemplary embodiment of the invention will be described below with reference to the attached drawings.
Organic Electroluminescence Device FIG. 4 is a cross section in a thickness direction of an organic electroluminescence device (referred to as organic EL device hereinafter) according to a first exemplary embodiment of the invention, where a part of the cross section is enlarged.

The organic EL device 1 is provided by laminating a light-transmissive substrate 2, a light-extraction layer 3, a transparent electrode 4, an organic emitting layer 5 and an opposing electrode 6 in this sequence.
Light-Transmissive Substrate The light-transmissive substrate 2 is a flat smooth plate member for supporting the light-extraction layer 3, the transparent electrode 4, the organic emitting layer 5 and the opposing electrode 6. The organic EL device 1 is a so-called bottom-emission device in which the radiation light generated in the organic emitting layer 5 is extracted in a direction of the light-transmissive substrate 2. Thus, the light-transmissive substrate 2 is provided by a light-transmissive member that preferably has a light transmittance of 50% or more in a visible light range of 400 nm to 700 nm. The light-transmissive substrate is exemplarily a glass plate, a polymer plate or the like. For the glass plate, such materials as soda-lime glass, barium/strontium-containing glass, lead glass, aluminosilicate glass, borosilicate glass, barium borosilicate glass, quartz and the like can be used. For the polymer plate, materials such as polycarbonate resins, acryl resins, polyethylene terephthalate resins, polyether sulfide resins and polysulfone resins can be used. A refractive index $n_2$ of the light-transmissive substrate 2 is preferably in a range from 1.4 to 1.6.
Light-Extraction Layer The light-extraction layer 3 is provided between the light-transmissive substrate 2 and the transparent electrode 4 in order to efficiently extract the radiation light generated in the organic emitting layer 5.

The light-extraction layer 3 is provided by laminating a high refractive index layer 31 and a low refractive index layer 32 in this order from the transparent electrode 4. The low refractive index layer 32 is adjacent to the light-transmissive substrate 2. The refractive index of the high refractive index layer 31 is higher than that of the low refractive index layer 32.

Further, as shown in FIG. 4, the high refractive index layer 31 has a plurality of recess-protrusion units 31A provided by protrusions 311 and recesses 312 at an interface with the low refractive index layer 32. The protrusions 311 protrude from the transparent electrode 4 toward the light-transmissive substrate 2 in a substantially cylindrical shape. As shown in FIG. 4, the protrusions 311 have an approximately rectangular cross-sectional shape.

FIGS. 5A, 5B and 5C (sometimes collectively referred to as FIG. 5 hereinafter) are plan views showing a part of the high refractive index layer 31 from the side of the light-transmissive substrate 2. In these drawings, the low refractive index layer 32 and the light-transmissive substrate 2 are omitted for the convenience of illustration. FIG. 5 exemplarily illustrates the arrangement pattern of the protrusions 311 and the recesses 312 of the high refractive index layer 31. In the arrangement pattern, the protrusions 311 may be arranged in a matrix as shown in FIG. 5B, in a close-pack structure as shown in FIG. 5A or in a manner so that the protrusions 311 are in contact with one another as shown in FIG. 5C as long as dimensional relationships of the high refractive index layer 31 and the recess-protrusion unit 31A (mentioned below) are satisfied. Further, the protrusions 311 may be arranged in a manner different from the above. The protrusions 311 and the recesses 312 may be reversely arranged. Specifically, the recesses 312 may be provided at the position of the protrusions 311 in FIG. 5 so that the high refractive index layer 31 is provided with holes.

In the first exemplary embodiment, the high refractive index layer 31 with the arrangement pattern shown in FIG. 5B is provided. Incidentally, FIG. 4 is a cross section taken along IV-IV line in FIG. 5B and seen in the direction of arrow.

In consequence of the multiple number of protrusions 311, the recesses 312 are formed where the protrusions 311 are not disposed. As shown in FIGS. 4 and 5, the protrusions 311 and the recesses 312 are alternately and continuously formed in cross section. One of the protrusions 311 and one of the recesses 312 constitute the recess-protrusion unit 31A. Since the low refractive index layer 32 is laminated with the high refractive index layer 31, the low refractive index layer 32 has recesses 322 corresponding to the protrusions 311 of the recess-protrusion units 31A and protrusions 321 corresponding to the recesses 312 of the recess-protrusion units 31A.

FIG. 6 is a partially enlarged cross section showing an interface between the high refractive index layer 31 and the low refractive index layer 32 of the light-extraction layer 3 seen in the same direction as in FIG. 4.

In this exemplary embodiment, an angle θ for a side face (protrusion side face) 311A to be inclined in the light-extraction direction of the organic EL device 1 (i.e. a direction from the organic emitting layer 5 toward the light-transmissive substrate 2: a direction orthogonal to the surface of the light-transmissive substrate 2) is preferably 35 degrees or less. By setting the inclination angle θ of the protrusion side face 311A at 35 degrees or less, a light Rc entering the interface between the high refractive index layer 31 and the low refractive index layer 32 at a critical angle θc or larger can be efficiently introduced to the inside of the low refractive index layer 32.

In this exemplary embodiment, the inclination angle θ is set approximately at 0 degree. Accordingly, the side face of the protrusion 311 is along the light-extraction direction. Further, an upper face (protrusion upper face) 311B along a width direction of the protrusion 311 is orthogonal to the light-extraction direction. A lower face 312A of the recess 312 of the recess-protrusion unit 31A (in other words, an upper face of the protrusion of the low refractive index layer 32 seen from the side of the low refractive index layer 32) is also along the direction orthogonal to the light-extraction direction.

In this exemplary embodiment, the dimensions of the light-extraction layer 3 and the recess-protrusion unit 31A are defined according to optical coherence length or a predetermined value. Initially, a distance $d_1$ from the interface between the high refractive index layer 31 and the transparent electrode 4 to the interface between the high refractive index layer 31 and the low refractive index layer 32 is equal to or longer than the optical coherence length.

Further, a height $d_2$ and a width $d_3$ of the protrusion 311 and a gap $d_4$ between the protrusion 311 constituting one of the recess-protrusion units 31A and the protrusion 311 constituting another one of the recess-protrusion units 31A are 1 μm or more, preferably, 5 μm or more and further preferably 20 μm or more. Incidentally, in order to efficiently extract the light in the thin-film mode, the height $d_2$ and the width $d_3$ of the protrusion 311 and the gap $d_4$ between the protrusions 311 are preferably 1 mm or less. The height $d_2$ represents a distance between a straight line passing through the upper face of the protrusion 311 and extending along the surface of the light-transmissive substrate 2 and a straight line passing through the lower face of the recess 312 and extending along the surface of the light-transmissive substrate 2 when the cross section of the organic EL device 1 is seen as shown in FIG. 4. The width $d_3$ represents a distance between right and left protrusion side faces 311A of the protrusion 311 in a direction along the light-transmissive substrate 2 when the cross section of the organic EL device 1 is seen as shown in FIG. 4. The gap $d_4$ represents a distance between one of right and left protrusion side faces 311A of the protrusion 311 and another protrusion side face 311A opposing to the one of right and left protrusion side faces 311A across the recess 312 in a direction along the surface of the light-transmissive substrate 2 when the cross section of the organic EL device 1 is seen as shown in FIG. 4.

Incidentally, the height $d_2$ and the width $d_3$ of the protrusion 311 preferably satisfy a relationship of $2.0 > d_2/d_3 > 0.2$, which is satisfied in this exemplary embodiment. More preferably, the height $d_2$ and the width $d_3$ of the protrusion 311 satisfy a relationship of $1.0 > d_2/d_3 > 0.5$. When the above relationship is satisfied, the light transmitted to the recess-protrusion unit 31A at the interface between the high refractive index layer 31 and the low refractive index layer 32 can be further efficiently transmitted to the low refractive index layer 32, so that the light-extraction efficiency can be further enhanced. When $d_2/d_3$ is larger than 2.0 (i.e. when the aspect ratio becomes large), the light refracted at the protrusion side face 311A is likely to enter again to the adjacent protrusion 311 to cause a multiple reflection and the like, thereby reducing the light-extraction efficiency.

Further, as described later, the organic emitting layer 5 may be provided by laminating organic emitting layers that are adapted to independently emit light. In such an arrangement, the optical coherence length is measured on the basis of the largest one of peak wavelengths of the radiation light generated by the plurality of organic emitting layers. For instance, when the organic emitting layers 5 each emitting red, green and blue lights are laminated and these emission colors are combined to emit white light from the organic EL device, since the peak wavelength of the red light is the largest, the optical coherence length is defined on the basis of the peak wavelength of the red light.

In order to measure a half bandwidth for calculating the optical coherence length, the half bandwidth is assumed to be defined by an emission spectrum of red-emitting molecules. For instance, when the peak wavelength is 610 nm and the half bandwidth is 10 nm, the optical coherence length is approximately 20 μm. Further, in order to obtain an illumination unit with excellent color rendering property, it is preferable that luminous molecules with large half bandwidth of the emission peak are used. For instance, when the half bandwidth of the emission peak is 60 nm, the optical coherence length is approximately 3.5 μm. Accordingly, a preferable range of the distance $d_1$ of the high refractive index layer 31 of the exemplary embodiment of the invention is 3 μm or more. Further, since the thickness of a practically used illumination panel is approximately 1 mm, the thickness of the high refractive index layer is preferably 1 mm or less.

The high refractive index layer 31 is formed by, for instance, a sol-gel reaction of an inorganic oxide such as titanium-series metalloxane polymer. Alternatively, the high refractive index layer 31 may be formed by dispersing particles of inorganic oxides and the like such as titania and zirconia that exhibit high refractive index on a general-purpose resin and subjecting to a coating method such as spin coating. Further, an episulfide resin material and the like may be used.

A refractive index $n_H$ of the high refractive index layer 31 is preferably in a range from 1.8 to 2.2. A material for forming the protrusion 311 of the high refractive index layer 31 may be different from that for forming the other part. In this case, it is preferable that the refractive indexes of both of the materials are set equal or the refractive index of the protrusion 311 is set lower.

Examples of the material for forming the low refractive index layer 32 include a glass material and a polymer material. Examples of the glass material include soda-lime glass, barium/strontium-containing glass, lead glass, aluminosilicate glass, borosilicate glass, barium borosilicate glass and quartz. For the polymer material, materials such as polycarbonate resins, acryl resins, polyethylene terephthalate resins, polyether sulfide resins, polysulfone resins and cycloolefin resins can be used. A refractive index $n_L$ of the low refractive index layer 32 is preferably in a range from 1.4 to 1.6. A material for forming the protrusion 321 of the low refractive index layer 32 may be different from that for forming the other part. In this case, it is preferable that the refractive indexes of both of the materials are set equal or the refractive index of the protrusion 321 is set higher than the refractive index of the other part.

Transparent Electrode

The transparent electrode 4 is provided adjacent to the high refractive index layer 31 of the light-extraction layer 3. In this exemplary embodiment, the transparent electrode 4 is an anode and the opposing electrode 6 is a cathode. It should be understood that the transparent electrode 4 may alternatively be a cathode and the opposing electrode 6 may alternatively be an anode.

A known electrode material is used for the transparent electrode 4. Examples of the electrode material include transparent electrode materials such as ITO (indium tin oxide) and IZO (tradename) (indium zinc oxide). A refractive index $n_1$ of the transparent electrode 4 is preferably in a range from 1.8 to 2.2.

Organic Emitting Layer

The organic emitting layer 5 is provided between the transparent electrode 4 and the opposing electrode 6.

The organic emitting layer 5 may be single-layered or, alternatively may be multilayered. A hole injecting layer, a hole transporting layer, an electron injecting layer, an electron transporting layer, a charge blocking layer and the like may be interposed between the transparent electrode 4 and the organic emitting layer 5 and between the transparent electrode 4 and the opposing electrode 6.

The organic emitting layer 5, which is formed of known emitting materials such as $Alq_3$, provides a single-color emission such as red, green, blue or yellow emission, and combined-color emission of red, green, blue and yellow emission (e.g., white emission). In forming the emitting layer, a doping method, according to which an emitting material (dopant) is doped to a host, has been known as a usable method. The emitting layer formed by the doping method can efficiently generate excitons from electric charges injected into the host. With the exciton energy generated by the excitons being transferred to the dopant, the dopant can emit light with high efficiency.

In the organic emitting layer 5 of the organic EL device of the exemplary embodiment of the invention, in addition to the above-mentioned compounds, any compound selected from known materials used in a conventional organic EL device can be selectively used.

Opposing Electrode

The opposing electrode 6 is provided adjacent to the organic emitting layer 5. A known electrode material is used for the opposing electrode 6.

The opposing electrode 6 is formed of a light-reflective material such as a metal (e.g. Al, Cu, Ag and Au) and an alloy.

The opposing electrode 6 may be single-layered or, alternatively, may be multilayered. The layers formed by light-reflective material(s) may be laminated. Alternatively, a layer provided by a transparent conductive member and a layer provided by a light-reflective material may be laminated.

Relative Relationship of Refractive Index

In the organic EL device 1, it is preferable that the refractive index $n_2$ of the light-transmissive substrate 2, the refractive index $n_H$ of the high refractive index layer 31, the refractive index $n_L$ of the low refractive index layer 32 and the refractive index $n_1$ of the transparent electrode 4 preferably satisfy the relationships shown in the above formulae (1) to (3). Incidentally, the refractive indexes $n_1$, $n_L$, $n_H$ and $n_2$ represent values at a wavelength of 550 nm.

Manufacturing Method of Organic EL Device

Formation of Low Refractive Index Layer

A low refractive index material for forming the low refractive index layer 32 is uniformly coated on the light-transmissive substrate 2. Here, the low refractive index material is a thermoplastic resin material. Next, a mold having a convexo-concave shape corresponding to a pattern in which a plurality of the recess-protrusion units 31A according to the first exemplary embodiment is provided is heated. The heated mold is pressed onto the low refractive index material to soften the material and to transfer the convexo-concave shape (thermal imprinting). Then, the mold and the low refractive index material are cooled approximately to a room temperature. When the mold is detached, the low refractive index layer 32 is formed on the light-transmissive substrate 2.

Formation of High Refractive Index Layer

A high refractive index material for forming the high refractive index layer 31 is uniformly coated on the low refractive index layer 32 on the light-transmissive substrate 2. Here, an ink composition provided by uniformly dispersing metal oxide particles in a resin binder is coated by spin coating. By adjusting the number of coating, the high refractive index material is filled in the recesses of the convexo-concave shape of the low refractive index layer 32 and the thickness of the high refractive index layer 31 (corresponding to the above distance $d_1$) is set at the optical coherence length or more. Subsequently, the ink composition is dried and solidified to form the high refractive index layer 31. Thus, the light-extraction layer 3 is formed.

Since the ink composition is coated on the convexo-concave shape molded on the low refractive index layer 32 to form the high refractive index layer 31, the high refractive index layer 31 assumes a shape corresponding to the recess-protrusion units 31A.

Formation of Organic Emitting Layer

After forming the light-extraction layer 3, the transparent electrode 4, the organic emitting layer 5 and the opposing electrode 6 are sequentially laminated on the high refractive index layer 31. The transparent electrode 4 and the opposing electrode 6 may be formed by a known method such as vacuum deposition and sputtering. The organic emitting layer 5 may be formed by a known method including dry film-forming such as vacuum deposition, sputtering, plasma deposition and ion plating, and wet film-forming such as spin coating, dipping, flow coating and ink jet.

Thus, the organic EL device 1 including the light-extraction layer 3 having the plurality of recess-protrusion units 31A can be obtained.

According to the above-described first exemplary embodiment, the following advantages can be obtained.

Since the distance $d_1$ from the interface between the transparent electrode 4 and the high refractive index layer 31 to the interface between the high refractive index layer 31 and the low refractive index layer 32 is equal to or more than the optical coherence length of the radiation light generated by the organic emitting layer 5, when the opposing electrode 6 is a reflective electrode, the radiation light is less likely to be coupled with the surface plasmon mode on the surface of the reflective electrode and is more likely to be coupled with the thin-film mode.

Further, since the light-extraction layer 3 is provided adjacent to the transparent electrode 4 and the recess-protrusion unit 31A is provided at the interface between the high refractive index layer 31 and the low refractive index layer 32, the light of the thin-film mode incident on the high refractive index layer 31 at the critical angle or more does not totally reflect at the interface but is transmitted to the low refractive index layer 32. In consequence, the light is extracted to the outside of the organic EL device 1 via the light-transmissive substrate 2.

Thus, the light-extraction efficiency of the radiation light generated in the organic emitting layer 5 can be enhanced.

Further, since the height $d_2$ and the width $d_3$ of the protrusions 311 of the high refractive index layer 31 and the gap $d_4$ between the protrusions are 1 μm or more and are sufficiently larger than the light wavelength in the visible light region, the white light is not likely to be dispersed unlike using a diffraction grating having periodicity and protrusion height of approximately submicron order. Accordingly, the organic EL device 1 provides a favorable white emission with small diffractiveness and is suitable for a light source of an illumination unit.

Since the refractive indexes of the light-transmissive substrate 2, the high refractive index layer 31, the low refractive index layer 32 and the transparent electrode 4 satisfy the relationship of the formulae (1) to (3), the total reflection of the light of the thin-film mode at the interface between the transparent electrode 4 and the high refractive index layer 31 can be restrained, so that the light is efficiently introduced to the interface between the high refractive index layer 31 and the low refractive index layer 32. Further, the total reflection of the light at the interface between the high refractive index layer 31 and the low refractive index layer 32 is restrained. Thus, the light-extraction efficiency of the radiation light generated in the organic emitting layer 5 can be further enhanced.

The height $d_2$ of the protrusion 311 and the width $d_3$ of the protrusion 311 satisfy the relationship of $2.0 > d_2/d_3 > 0.2$, the protrusion side face 311A has a shape extending along the light-extracting direction (i.e. inclination angle θ being approximately 0 degree), and the protrusion upper face 311B has a shape extending along a direction orthogonal to the light-extraction direction. Accordingly, the light transmitted to the recess-protrusion unit 31A at the interface between the high refractive index layer and the lower refractive index layer can be further efficiently transmitted to the low refractive index layer. In other words, since the protrusions 311 have a substantially rectangular shape protruding in the light-extracting direction, the light incident on the light-extraction layer 3 at the critical angle or more can be refracted by the protrusion side face 311A to be efficiently guided to the low refractive index layer 32. Thus, the light-extraction efficiency can be further enhanced.

Second Exemplary Embodiment

Next, a second exemplary embodiment of the invention will be described below with reference to the attached drawings.

Organic Electroluminescence Device

FIG. 7 is a cross section in a thickness direction of an organic EL device 40 according to the second exemplary embodiment of the invention, where a part of the cross section is enlarged.

The organic EL device 40 according to the second exemplary embodiment has a structure similar to that of the organic EL device 1 according to the first exemplary embodiment except for an electron transporting zone 41 provided between the organic emitting layer 5 and the opposing electrode 6 of the organic EL device 1 and a hole transporting zone 42 provided between the organic emitting layer 5 and the transparent electrode 4. Specifically, the organic EL device 40 is provided by laminating the light-transmissive substrate 2, the light-extraction layer 3, the transparent electrode 4, the hole transporting zone 42, the organic emitting layer 5, the electron transporting zone 41 and the opposing electrode 6 in this sequence. The organic EL device 40 is a so-called bottom-emission device in which the radiation light generated in the organic emitting layer 5 is extracted in a direction of the light-transmissive substrate 2.

In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

Electron Transporting Zone

The electron transporting zone 41 helps the electrons to be injected to the organic emitting layer 5 and transports the electrons to the emitting region. The electron transporting region 41 exhibits a high electron mobility. The electron transporting zone 41 is provided by at least one of an electron injecting layer and an electron transporting layer. The electron transporting zone 41 may be provided by one of the electron injecting layer and the electron transporting layer or may be provided by a laminated structure of the electron injecting layer and the electron transporting layer. In other words, the electron transporting zone refers to an organic layer structure that is interposed between the cathode and the emitting layer and is provided with a function for transporting the electrons from the cathode to the emitting layer.

A film thickness of the electron transporting zone 41 is preferably 70 nm or more.

By setting the thickness of the electron transporting zone 41 at 70 nm or more, external quantum efficiency can be further enhanced by a synergistic effect with the light-extraction layer 3 described in the first exemplary embodiment.

The reason of the enhancement in the external quantum efficiency can be speculated as follows with reference to a device structure A3.

Device Structure A3

The device structure A3 is similar to the above device structure A1 except that the opposing electrode is provided by aluminum (Al) and an electron injecting layer is interposed between the opposing electrode and the electron transporting layer (electron transporting zone). The emitting layer emits red light.

In the device structure A3, when the luminous molecules contained in the emitting layer are assumed as electrical dipole moments, separate examinations are made on an arrangement where the luminous molecules are oriented in a vertical direction and an arrangement where the luminous molecules are oriented in a parallel direction.

While changing the thickness of the electron transporting layer for the device structure A3, the Photonic mode density is analyzed for a dipole radiation of luminous molecules oriented in the parallel direction and a dipole radiation of luminous molecules oriented in the vertical direction, as in the case of the device structure A1.

FIG. 8 is a graph showing a result of Photonic mode density analysis of the dipole radiation of parallely oriented luminous molecules. Specifically, FIG. 8 shows a relationship between a thickness of the electron transporting zone and a coupling efficiency of the dipole radiation of the luminous molecules. According to FIG. 8, it can be understood that the efficiency for the dipole radiation to couple with the surface plasmon mode (SPPs coupling efficiency) is reduced in accordance with an increase in the thickness of the electron transporting layer. It is also understood that the efficiency for coupling with each of the substrate mode, the thin-film mode and the emission mode is increased in accordance with the decrease in the SPPs coupling efficiency.

According to the analysis result, when the thickness of the electron transporting layer becomes 70 nm, the SPPs coupling efficiency is decreased to approximately 15% and the coupling efficiency with the thin-film mode is enhanced up to approximately 15%. Accordingly, the thickness of the electron transporting zone is preferably 70 nm or more.

Incidentally, since the thickness of the electron transporting layer provided as the electron transporting zone of a typical organic EL device is approximately 30 nm, the SPPs coupling efficiency is relatively as high as approximately 60% and the coupling efficiency to the thin-film mode is as low as approximately 5%.

By providing the light-extraction layer 3 described in the first exemplary embodiment between the light-transmissive substrate and the light-transmissive electrode in the device structure A3, the light of the thin-film mode with enhanced coupling efficiency can be efficiently extracted to the outside of the device.

Then, by setting the thickness of the electron transporting layer at 70 nm or more and by providing the light-extraction layer 3 in the device structure A3, the ratio for the parallely oriented luminous molecules to be coupled with the thin-film mode of the dipole radiation is increased. Accordingly, as compared with an instance in which the light-extraction layer 3 is provided to an organic EL device of which an electron transporting layer is approximately 30 nm thick, the light that can be extracted to the outside of the device increases in accordance with the increase in the coupling ratio.

As described above, since the organic EL device 40 according to the second exemplary embodiment has the electron transporting zone 41 with a thickness of 70 nm or more and the light-extraction layer 3 of the first exemplary embodiment, external quantum efficiency can be further enhanced.

FIG. 9 is a graph showing a result of Photonic mode density analysis of the dipole radiation of vertically oriented luminous molecules. Specifically, FIG. 9 shows a relationship between the thickness of the electron transporting zone and the coupling efficiency of the dipole radiation of the luminous molecules. According to FIG. 9, it can be understood that the SPPs coupling efficiency is not reduced unlike in FIG. 8 even when the thickness of the electron transporting zone is increased. Practically, when the thickness of the electron transporting zone is 250 nm or more, the SPPs coupling efficiency is decreased. Incidentally, when the thickness of the electron transporting zone exceeds 300 nm, formation of the layer requires much time or driving voltage is increased. Accordingly, the thickness of the electron transporting zone is preferably 300 nm or less.

Material of Electron Transporting Zone

Examples of the material usable for the electron injecting layer and the electron transporting layer include 8-hydroxyquinoline, a metal complex of a derivative of 8-hydroxyquinoline, an oxadiazole derivative, a nitrogen-containing heterocyclic derivative, a silacyclopentadiene derivative, a borane derivative and a gallium complex disclosed in JP-A-2009-199738 and JP-A-2008-166629. However, the material for the electron injecting layer and electron transporting layer is not specifically limited as long as the material has the characteristics of electron transporting zone. Any materials conventionally used for transporting charges of the electrons in photoconducting materials or any materials publicly known to be applicable to the electron injecting layer or electron transporting layer of organic EL devices may be used.

Further, the electron transporting zone 41 preferably contains a reduction-causing dopant. When the reduction-causing dopant is contained, the electron transporting zone 41 helps the electrons to be injected to the organic emitting layer 5 and transports the electrons to the emitting region even when the thickness of the electron transporting zone 41 is large as in the organic EL device 40. The reduction-causing dopant may be present at an interfacial region between the opposing electrode 6 and the electron transporting zone 41.

The reduction-causing dopant is defined as a substance capable of reducing an electron-transporting compound. Thus, various substances having a certain level of reducibility can be used, preferable examples of which are at least one substance selected from a group consisting of: alkali metal, alkali earth metal, rare earth metal, an oxide of the alkali metal, a halogenide of the alkali metal, an oxide of the alkali earth metal, a halogenide of the alkali earth metal, an oxide of the rare earth metal, a halogenide of the rare earth metal, an organic complex of the alkali metal, an organic complex of the alkali earth metal and an organic complex of the rare earth metal.

Specifically, a preferable reduction-causing dopant has work function of 2.9 eV or less, which is at least one alkali metal selected from a group of Li (work function: 2.9 eV), Na (work function: 2.36 eV), K (work function: 2.28 eV), Rb (work function: 2.16 eV) and Cs (work function: 1.95 eV), or at least one alkali earth metal selected from a group of Ca (work function: 2.9 eV), Sr (work function: 2.0 to 2.5 eV) and Ba (work function: 2.52 eV). Among the above, a more preferable reduction-causing dopant is at least one alkali metal selected from a group of K, Rb and Cs. A further more preferable reduction-causing dopant is Rb or Cs. The most preferable reduction-causing dopant is Cs. Since the above alkali metals have particularly high reducibility, addition of a relatively small amount of these alkali metals to an electron injecting zone can enhance luminance intensity and lifetime of the organic EL device. As a reduction-causing dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reduction-causing dopant containing Cs in a combining manner can efficiently exhibit reducibility. Addition of the reduction-causing dopant to the electron injecting zone can enhance luminance intensity and lifetime of the organic EL device.

Further, an electron injecting layer formed by an insulator or a semiconductor may be provided between the opposing electrode 6 and the electron transporting zone 41. With the arrangement, leak of electric current can be effectively prevented and the electron injecting capability can be enhanced. As the insulator, it is preferable to use at least one metal compound selected from a group of an alkali metal chalcogenide, an alkali earth metal chalcogenide, a halogenide of alkali metal and a halogenide of alkali earth metal. By forming the electron injection layer from the alkali metal chalcogenide or the like, the electron injection capability can further be enhanced, which is preferable. Specifically, preferable examples of the alkali metal chalcogenide are $Li_2O$, $K_2O$, $Na_2S$, $Na_2Se$ and $Na_2O$, while preferable examples of the alkali earth metal chalcogenide are CaO, BaO, SrO, BeO, BaS and CaSe. Preferred examples of the halogenide of the alkali metal are LiF, NaF, KF, LiCl, KCl and NaCl. Preferable examples of the halogenide of the alkali earth metal are fluorides such as $CaF_2$, $BaF_2$, $SrF_2$, $MgF_2$ and $BeF_2$, and halogenides other than the fluoride.

Examples of the semiconductor for forming the electron injecting layer are one of or a combination of two or more of an oxide, a nitride or an oxidized nitride containing at least one element selected from Ba, Ca, Sr, Yb, Al, Ga, In, Li, Na, Cd, Mg, Si, Ta, Sb and Zn. An inorganic compound for forming the electron transporting layer is preferably a microcrystalline or amorphous insulating film. When the electron transporting layer is formed of such insulating film, more uniform thin film can be formed, thereby reducing pixel defects such as a dark spot. Examples of such inorganic compound may include the above-described alkali metal chalcogenide, alkali earth metal chalcogenide, halogenide of the alkali metal and halogenide of the alkali earth metal.

Hole Transporting Zone

The hole transporting zone 42, which aids injection of the holes into the organic emitting layer 5, has a high hole mobility. The hole transporting zone 42 may be provided by one of a hole injecting layer and a hole transporting layer or may be provided by a single layer having a hole injecting ability and a hole transporting ability. The hole transporting zone 42 may include a blocking layer adjacent to the organic emitting layer 5.

Material of Hole Transporting Zone

The materials for the hole transporting zone 42 are not specifically limited, and may be suitably selected among the materials used for the hole injecting layer and hole transporting layer disclosed in, for instance, JP-A-2009-199738 as well as those typically and widely used as hole charge transporting materials in photoconductive materials and those typically used in hole injecting layers and hole transporting layers of organic EL devices.

Third Exemplary Embodiment

Next, a third exemplary embodiment of the invention will be described below with reference to the attached drawings.

Organic EL Device

FIG. 10 is a cross section in a thickness direction of an organic EL device 50 according to the third exemplary embodiment of the invention, where a part of the cross section is enlarged.

The organic EL device 50 according to the third exemplary embodiment has a structure similar to that of the organic EL device 40 according to the second exemplary embodiment except for an intermediate unit 5A provided between the electron transporting zone 41 and the transparent electrode 4 of the organic EL device 40 and a plurality of organic emitting layers 51, 55 and 56 sandwiching the intermediate unit 5A. Specifically, the organic EL device 50 is provided by laminating the light-transmissive substrate 2, the light-extraction layer 3, the transparent electrode 4, the hole transporting zone 42, the first organic emitting layer 51, the intermediate unit 5A, the second organic emitting layer 55, the third organic emitting layer 56, the electron transporting zone 41 and the opposing electrode 6 in this sequence. The device structure exemplified by the organic EL device 50 in which a plurality of the organic emitting layers 51, 55 and 56 are laminated with an intermediate unit therebetween and are serially connected is called a tandem type. The organic EL device 50 is a so-called bottom-emission device in which the radiation light generated in the organic emitting layers 51, 55 and 56 is extracted in a direction of the light-transmissive substrate 2.

In the description of the third exemplary embodiment, the same components as those in the first exemplary embodiment and the second exemplary embodiment are denoted by the same reference signs and names to simplify or omit an explanation of the components. In the third exemplary embodiment, the same materials and compounds as described in the first and second exemplary embodiments are usable.

Organic Emitting Layer

The same materials as described in the first exemplary embodiment are usable for the organic emitting layers 51, 55 and 56. The first organic emitting layer 51, the second organic emitting layer 55 and the third organic emitting layers 56 may be provided by the same material or may be provided by different materials. The emission colors of the first organic emitting layer 51, the second organic emitting layer 55 and the third organic emitting layers 56 may not be the same. For instance, the first organic emitting layer 51, the second organic emitting layer 55 and the third organic emitting layers 56 may respectively emit blue, green and red lights.

Intermediate Unit

The intermediate unit 5A injects holes or electrons to the organic emitting layers 51, 55 and 56.

As shown in FIG. 10, the intermediate unit 5A of the organic EL device 50 has an electron injecting layer 52, an intermediate layer 53 and a hole injection layer 54 in the intermediate unit in this sequence from the side of the first organic emitting layer 51.

The materials for the respective layers 52, 53 and 54 of the intermediate unit 5A may be selected as desired from among the known materials used for forming an intermediate unit of a tandem organic EL device. For instance, the structures and materials disclosed in JP-A-11-329748, JP-A-2006-66380, JP-A-2006-173550, JP-A-2010-92741 and JP-A-2004-281371 are applicable.

The organic EL device 50 according to the third exemplary embodiment has the electron transporting zone 41 with a thickness of 70 nm or more and the light-extraction layer 3 of the first exemplary embodiment. Further, the organic EL device 50 has a device structure in which the plurality of organic emitting layers 51, 55 and 56 are laminated through the intermediate unit 5A and are serially connected. Thus, as compared with the organic EL device 1 according to the first exemplary embodiment and the organic EL device 40 according to the second exemplary embodiment having a single organic emitting layer, external quantum efficiency can be easily enhanced.

Modifications of Exemplary Embodiment

It should be noted that the invention is not limited to the above exemplary embodiments but may include the following modifications as long as such modifications are compatible with an object of the invention.

In the first exemplary embodiment, the protrusions 311 of the recess-protrusion unit 31A protrude from the transparent electrode 4 toward the light-transmissive substrate 2 in a substantially cylindrical shape and the protrusions 311 have approximately rectangular cross-sectional shape as shown in FIG. 4. However, the protrusions 311 may have other shapes.

FIGS. 11A, 11B and 11C are plan view showing a part of the high refractive index layer 31 from the side of the light-transmissive substrate 2 in the same manner as FIG. 5. As shown in FIGS. 11A and 11B, the protrusions 311 may be provided as quadrangular columns protruding in quadrangles in plan view. The protrusions 311 may be arranged in a matrix as shown in FIG. 11A or may be arranged in a close-pack structure as shown in FIG. 11B. Alternatively, the protrusions 311 may be arranged in a houndstooth check pattern (not shown). Further alternatively, as shown in FIG. 11C, the protrusions 311 may be provided as triangular columns protruding in triangles in plan view.

The gap, width and height of the protrusions 311 may not be the same among all of the recess-protrusion units 31A. Further, the protrusions 311 may be arranged not regularly but in random.

Further, the above dimensional relationship of the height $d_2$, the width $d_3$ and the gap $d_4$ for defining the recess-protrusion unit 31A may not be satisfied by all of the recess-protrusion units 31A but it is sufficient that at least one of the recess-protrusion units 31A satisfies the relationship.

Further, in the organic EL device 1 described in the first exemplary embodiment, the above dimensional relationship between the light-extraction layer 3 and the recess-protrusion unit 31A defined by the optical coherence length may be satisfied not in the cross section taken along IV-IV line in FIG. 5B but in a cross section taken along V-V line in FIG. 5B.

An example of a cross-sectional shape of the protrusion different from the above exemplary embodiments will be described below as a modification. FIG. 12 is a vertical cross section in a substrate thickness direction showing a part of an organic EL device 20 according to a modification of the invention. In the description of the organic EL device 20, the same components as those in the above exemplary embodiments are denoted by the same reference signs to simplify or omit an explanation of the components.

As shown in FIG. 12, the high refractive index layer 31 has a plurality of recess-protrusion units 33A provided by protrusions 331 of which width is narrowed from near the transparent electrode 4 toward the light-transmissive substrate 2 and recesses 332 of which width is widened conversely to the protrusions 331. Since the low refractive index layer 32 is laminated with the high refractive index layer 31, the low refractive index layer 32 has recesses 342 corresponding to the protrusions 331 of the recess-protrusion units 33A and protrusions 341 corresponding to the recesses 332 of the recess-protrusion units 33A.

In this exemplary embodiment, an inclination angle θ for a protrusion side face 331A of the recess-protrusion unit 33A to be inclined relative to a direction orthogonal to the light-extraction direction of the organic EL device 20 (i.e. a direction from the organic emitting layer 5 toward the light-transmissive substrate 2: a direction orthogonal to the surface of the light-transmissive substrate 2) is approximately 30 degrees. Further, a protrusion upper face 331B extends along the direction orthogonal to the light-extraction direction.

In this organic EL device 20, the dimensions of the light-extraction layer 3 and the recess-protrusion unit 33A are defined according to optical coherence length. Initially, a distance $d_1$ from the interface between the high refractive index layer 31 and the transparent electrode 4 to the interface between the high refractive index layer 31 and the low refractive index layer 32 is equal to or longer than the optical coherence length.

Further, a height $d_2$ and a width $d_3$ of the protrusion 331 and a gap $d_4$ between the protrusion 331 constituting one of the recess-protrusion unit 33A and the protrusion 331 constituting another one of the recess-protrusion unit 33A are 1 μm or more, preferably, 5 μm or more and further preferably 20 μm or more. Incidentally, in order to efficiently extract the light in the thin-film mode, the height $d_2$ and the width $d_3$ of the protrusion 331 and the gap $d_4$ between the protrusions 331 are preferably 1 mm or less.

In an arrangement in which the protrusion side face 331A is inclined as shown in FIG. 12, it is only necessary that the above defined values of $d_2$ to $d_4$ are met when the dimension of the width $d_3$ and the gap $d_4$ are defined at any position on the protrusion side face 331A in the same manner as in the first exemplary embodiment.

Further, in this modification, the height $d_2$ and the width $d_3$ of the protrusion 331 preferably satisfy a relationship of $2.0 > d_2/d_3 > 0.2$, more preferably $1.0 > d_2/d_3 > 0.5$.

The light-extraction efficiency of the radiation light generated in the organic emitting layer can also be enhanced in this organic EL device 20. Further, the light-extraction efficiency of the radiation light can also be enhanced according to the shape of the recess-protrusion unit 33A. The organic EL device 20 is also suitable as a light source of an illumination unit.

Another example of a cross-sectional shape of the protrusion of the high refractive index layer different from that of the above exemplary embodiments will be described below.

FIG. 13 is a vertical cross section showing a part of an organic EL device 30 according to a modification of the invention. In the description of the organic EL device 30, the same components as those in the above exemplary embodiments are denoted by the same reference signs to simplify or omit an explanation of the components.

As in this organic EL device 30, both ends of the protrusion upper faces 351B of the recess-protrusion units 35A provided by protrusions 351 and recesses 352 may be curved. The light-extraction efficiency can be enhanced even by the above shape as long as the dimensional relationship of $d_2$ to $d_4$ in the recess-protrusion unit 35A is approximately equal to or larger than the wavelength in the visible light region described in the above exemplary embodiments. The organic EL device 30 is also suitable as a light source of an illumination unit.

Each of the high refractive index layer 31 and the low refractive index layer 32 of the light-extraction layer 3 may not be single-layered but may be multilayered so as to satisfy the relationships of the above formulae (1) to (3).

In addition, though the organic EL device is described as a bottom-emission device in the above exemplary embodiments, the organic EL device may not be a bottom-emission device. For instance, the invention is applicable to a top-emission device.

The light-extraction layer 3 may be formed in a manner other than that described in the above exemplary embodiments.

For instance, a pattern corresponding to the shape of the plurality of recess-protrusion units 31A may be transferred to a film of a material forming the high refractive index layer 31 and having a thickness equal to or more than the sum of the distance $d_1$ and the height $d_2$ to form a convexo-concave pattern. Subsequently, a solution of a material forming the low refractive index layer 32 may be applied on the surface of the high refractive index layer 31 on which the convexo-concave pattern is formed to form the low refractive index layer 32, thereby forming the light-extraction layer 3. Incidentally, the convexo-concave pattern may be formed on a film of a material forming the low refractive index layer 32 and a solution of a material for forming the high refractive index layer 31 may be applied thereon to provide the high refractive index layer 31.

Alternatively, a convexo-concave pattern corresponding to the shape of the plurality of recess-protrusion units 31A may be formed by applying a resin binder in which fine particles of titania or zirconia are dispersed on a base film of a material forming the high refractive index layer 31 and having a thickness of more than the distance $d_1$. Subsequently, a solution of a material forming the low refractive index layer 32 may be applied on the surface on which the convexo-concave pattern is formed to form the low refractive index layer 32, thereby forming the light-extraction layer 3. Incidentally, the high refractive index layer 31 and the low refractive index layer 32 may also be reversely formed. The refractive index $n_p$ of the dispersed particles satisfy a relationship of $n_H \leq n_p$.

The light-extraction layer 3 thus formed and the light-transmissive substrate 2 are laminated by, for instance, adhering the light-extraction layer 3 and the light-transmissive substrate 2 with an adhesive and the like of which refractive index is substantially equal to the refractive index of the material forming the low refractive index layer 32.

The organic EL device of the invention may include a second light-extraction layer adjacently provided at an upper outer side of the light-transmissive substrate. The second light-extraction layer may be provided by a structure for restraining the total reflection, such as a diffusion sheet of particles, a microlens, a micro prism and a convexo-concave structure. Since the second light-extraction layer is interposed at the interface between the light-transmissive substrate and an outside of the organic EL device, the total reflection at the interface can be avoided, thereby further enhancing the light-extraction efficiency.

In a tandem organic EL device, without providing the three organic emitting layers as in the organic EL device 50 described in the third exemplary embodiment, the first organic emitting layer 51 and the second organic emitting layer 55 sandwiching the intermediate unit 5A may be provided.

Further, a plurality of intermediate units may be provided in the device.

The emission color of each of the organic emitting layers may be the same or different. At this time, emitting layers that emit red (R), green (G) and blue (B) may be provided and the colors may be combined to provide a white emitting device.

EXAMPLES

Next, the invention will be described in further detail by exemplifying Example(s). However, the invention is not limited by the description of Example(s).

In these Examples, an organic EL device was manufactured, a drive test was performed and the light-extraction efficiency was measured.

1. Manufacturing of Organic EL Device

Example 1

(1) Formation of Low Refractive Index Layer

Polymethyl methacrylate (PMMA: manufactured by Wako Pure Chemical Industries Ltd. (average molecular weight: 100,000)) was dissolved in xylene so that solid content concentration became 15 mass % to prepare a coating liquid for forming a low refractive index layer (viscosity: 30 cP). Subsequently, the coating liquid was applied on a glass substrate of 25 mm×25 mm×0.7 mm thick (NA35 manufactured by Nippon Sheet Glass Co., Ltd.) and refractive index of 1.50 (wavelength=550 nm) by spin coating. The coating liquid was applied while keeping rotation at 1500 rpm for 60 seconds.

Subsequently, the glass substrate was held on a hot plate of 150 degrees C. for 30 minutes to dry the coating liquid, thereby forming a PMMA film. The thickness of the PMMA film was 2.2 µm. The same operations (coating and drying) were repeated for a number of times to form a film of 20 µm thick.

An ellipsometer manufactured by J. A. Woollam Co. was used for measuring the refractive index. The measured value of the refractive index was 1.50 (wavelength=550 nm). The following refractive indexes were similarly measured.

Next, a light-extraction pattern was transferred to the above PMMA film by thermal imprinting. A mold having the light-extraction pattern formed on a silicon substrate of 25 mm×25 mm×0.7 mm thick by photolithography was used.

The glass substrate on which the PMMA film was formed and the mold were overlaid and were put on a stage of a thermal imprinting apparatus. An opposing plate was pressed onto the PMMA film with a pressure of 2 MPa and the heating temperature was set so that the temperature of the PMMA film became 140 degrees C. The state was kept for one minute in order to soften the PMMA film. Then, the heating of the stage and the opposing plate was stopped and cooling water was supplied for cooling. When the temperature of the mold and the PMMA film returned to a room temperature, the pressure was released and the PMMA-film-formed substrate and the mold were extracted. The substrate and the mold were separated to obtain the PMMA film (i.e. a low refractive index layer transferred with the light-extraction pattern on a glass substrate). When the PMMA film was observed by a scanning electron microscope, it was found that cylindrical columns of 20 µm depth and 20 µm diameter were formed at 20 µm intervals.

(2) Formation of Low Refractive Index Layer

A mixed material of titanium oxide particles and resin was used as a high refractive index material. Highly transparent particulated titanium oxide slurry manufactured by Tayca Corporation (titanium oxide particle diameter: 15 to 25 nm, solvent: propylene glycol monomethyl ether) was used as titanium oxide particle slurry. BECKOLITE (M-6401-50) and SUPER BECKAMINE (J-820-60) manufactured by DIC CORPORATION were used as the resin. An ink for forming a high refractive index layer was prepared so that the solid mass ratio of the three components became 7.00:0.85:0.15 and the total solid content concentration became 33 mass %. The viscosity of the ink was 42 cP.

In order to measure the refractive index of the high refractive material film, the ink was applied on another glass substrate by spin coating. Subsequently, the ink was dried at 100 degrees C. to form a high refractive material film. The thickness of the high refractive material film was 3.3 μm. Further, the refractive index of the high refractive material film was 1.83 (wavelength=550 nm).

The ink was applied on the PMMA film (high refractive index layer), which had the light-extraction pattern on the substrate prepared by the thermal imprinting, by spin coating. The coating was conducted while keeping rotation at 1500 rpm for 60 seconds. Subsequently, the film was held on a hot plate of 100 degrees C. for 60 minutes to dry the ink, thereby forming a high refractive material film. The same operations (coating and drying) were repeated for twelve times.

The glass substrate was cut along the thickness direction of the substrate. When the cross section was observed by a scanning electron microscope, it was found that a light-extraction layer and the recess-protrusion unit were formed by the lamination of the above PMMA film (low refractive index layer) and the high refractive index material film (high refractive index layer) from the glass substrate. The dimensions of the light-extraction layer and the recess-protrusion unit described in the first exemplary embodiment were: the distance $d_1$=20 μm; the height $d_2$=20 μm; the width $d_3$=20 μm; and the gap $d_4$=20 μm.

(3) Formation of Organic EL Layer

An organic EL layer was laminated on the high refractive index layer on the glass substrate by vacuum deposition. The arrangement of the organic EL layer was as follows: The first emitting layer was a red emitting layer. The second emitting layer was a blue emitting layer. The third emitting layer was a green emitting layer.

Transparent electrode: ITO (thickness: 130 nm, refractive index: 1.85 (wavelength 550 nm))

Hole injecting layer: compound HI (thickness: 60 nm)

Hole transporting layer: compound HT (thickness: 15 nm)

Organic emitting layer (first emitting layer): compound RH and compound RD (thickness: 5 nm, RD concentration: 0.5 mass %)

Charge blocking layer: compound HT and compound GD (thickness: 5 nm, GD concentration: 5 mass %)

Organic emitting layer (second emitting layer): compound BH and compound BD (thickness: 15 nm, BD concentration: 7.5 mass %)

Organic emitting layer (third emitting layer): compound BH and compound GD (thickness: 25 nm, GD concentration: 10 mass %)

Electron transporting layer: tris(8-quinolynol)aluminum film (Alq$_3$) (thickness: 20 nm)

Electron injecting layer: LiF (thickness: 1.6 nm)

Opposing electrode: Al (thickness: 150 nm)

Compounds used for the organic EL device are shown below.

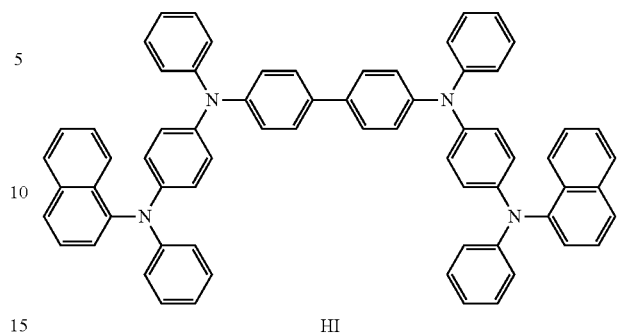

[Formula 1]

HI

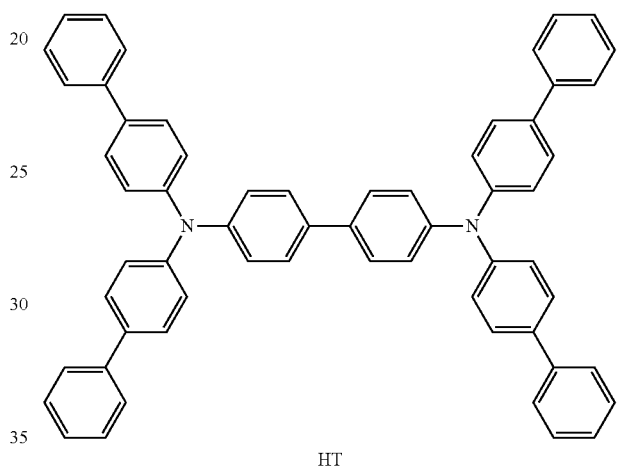

HT

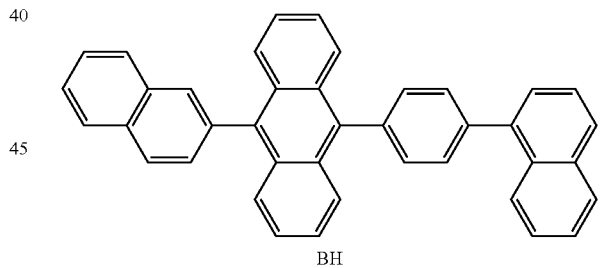

BH

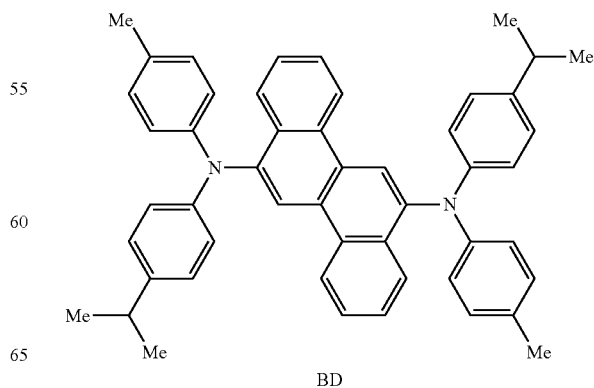

BD

-continued

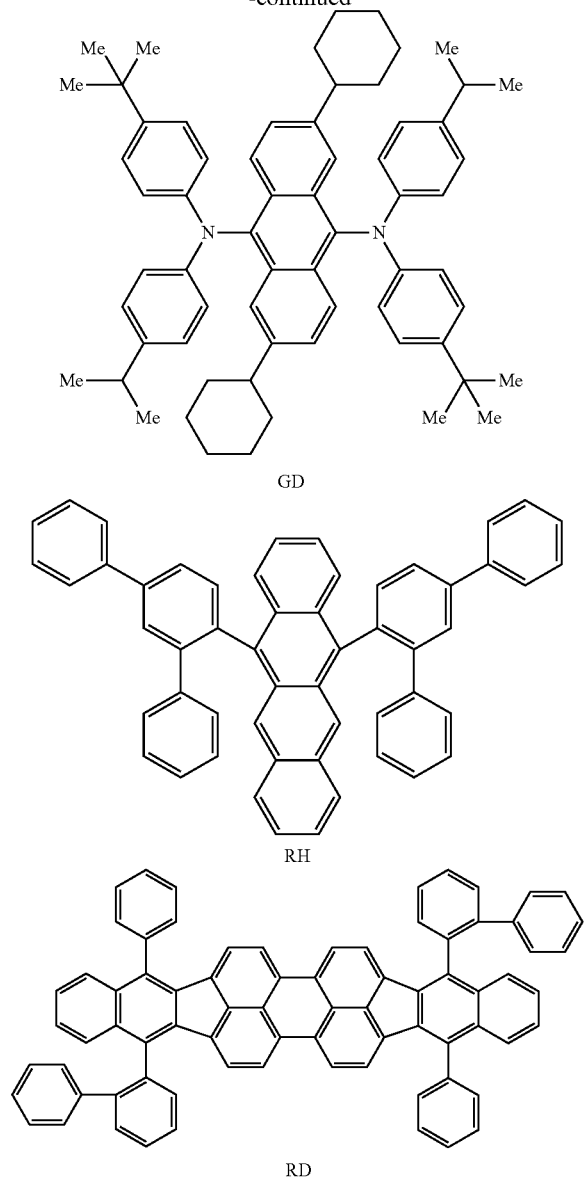

GD

RH

RD

Example 2

An organic EL device was manufactured in the same manner as in Example 1 except that the light-extraction pattern was arranged so that cylindrical columns of 50 μm diameter and 50 μm height were arrayed in a hexagonal closest packing structure (see FIG. 5A) at a 50 μm interval between the closest ones of the columns. The dimensions of the light-extraction layer and the recess-protrusion unit described in the first exemplary embodiment were: the distance $d_1$=20 μm; the height $d_2$=50 μm; the width $d_3$=50 μm; and the gap $d_4$=50 μm.

Comparative 1

An organic EL device was manufactured in the same manner as in the Example 1, except that the light-extraction layer (the low refractive index layer and the high refractive index layer) was not formed.

Comparative 2

An organic EL device was manufactured in the same manner as in Example 1 except that the light-extraction pattern was changed so that cylindrical columns of 20 μm diameter and 20 μm height were arrayed in a hexagonal the closest packing structure at a 20 μm interval between closest ones of the columns and that the number of formation processes (coating and drying) of the high refractive material film was reduced so that the distance $d_1$ falls below the optical coherence length (0.5 μm). The dimensions of the light-extraction layer and the recess-protrusion unit were: the distance $d_1$=0.5 μm; the height $d_2$=20 μm; the width $d_3$=20 μm; and the gap $d_4$=20 μm.

(2) Drive Test

In the drive test of the organic EL device, voltage was applied to the organic EL device so that a current density became 10 mA/cm$^2$, and EL emission spectrum at that time was measured by a spectro radio meter (CS-1000: manufactured by Konica Minolta Sensing, Inc.).

FIGS. 14A and 14B schematically show an evaluation method of a structure of an organic EL device.

In order to measure a radiation strength of total luminous flux, a cylindrical lens 8 was attached to the light-transmissive substrate 2 (glass substrate) of the organic EL device 1 as shown in FIG. 14A to measure an angular dependence of the emission spectrum. The refractive index of the cylindrical lens 8 was set to be equal to the refractive index (1.5) of the glass substrate 2. In order to eliminate air gap, a space between the cylindrical lens 8 and the glass substrate 2 was filled with oil having a refractive index of approximately 1.5. While changing the radiation angle θ from 0 degree to 70 degrees in increments of 5 degrees, the EL emission spectrum was measured by the spectro radio meter 9.

Those manufactured in Examples 1 and 2 and Comparatives 1 and 2 were used as the organic EL device 1.

Luminous energy of the total luminous flux was obtained based on a spectral radiance spectrum of the obtained angular dependence to calculate the light-extraction efficiency. Table 2 shows the external quantum efficiency normalized with reference to the external quantum efficiency of Comparative 1. Incidentally, an instance in which the light-extraction layer is not provided (corresponding to Comparative 1) is illustrated in FIG. 14B as the structure of the organic EL device 1. When the light-extraction layer is provided, the light-extraction layer is provided between the light-transmissive substrate 2 and the transparent electrode 4.

TABLE 2

| | External Quantum Efficiency (after normalization) |
|---|---|
| Comparative 1 (reference) | 1.00 |
| Example 1 | 1.62 |
| Example 2 | 1.52 |
| Comparative 2 | 1.40 |

3. Evaluation of Light-Extraction Layer

Next, the structure of the light-extraction layer was evaluated.

FIGS. 15A and 15B schematically show an evaluation method of a structure of a light-extraction layer. A cylindrical lens 9 (the same as that mentioned in the above 2.) was attached onto the low refractive index layer 32 of the light-extraction layer 3 (see FIG. 15B) in which the high refractive index layer 31 and the low refractive index layer 32 were laminated. Then, white light was radiated in the direction of an arrow shown in FIG. 15A and the scattered diffraction spectrum was measured by the spectro radio meter 9 (CS-1000). In order to eliminate air gap, a space between the cylindrical lens 8 and the low refractive index layer 32 was filled with oil having a refractive index of approximately 1.5. While changing the radiation angle θ from 0 degree to 70 degrees in increments of 5 degrees, the EL emission spectrum was measured by the spectro radio meter 9.

Those manufactured in Examples 1 and 2 and Comparative 2 were used as the light-extraction layer 3.

Based on the measurements of the angular dependence of the obtained spectral radiance spectrum, diffractiveness of the light-extraction layer was evaluated.

As understood from Table 2, the organic EL devices according to the Examples 1 and 2 exhibited excellent external quantum efficiency. This is because the organic EL device of the Examples 1 and 2 satisfied the relationship of refractivity defined in above formulae (1) to (3) and the distance $d_1$ was equal to or more than the optical coherence length for the light of peak wavelength of 610 nm and half bandwidth of 23 nm generated in the organic emitting layer, so that the coupling efficiency of the light to the thin-film mode was enhanced and the total reflection of the light at an interface was avoided. The optical coherence length was 8.8 μm in a high refractive index layer.

Further, the height $d_2$, width $d_3$ and gap $d_4$ were sufficiently larger than the wavelength of the light generated in the organic emitting layer, so that the angular dependence of the emission spectrum was small (i.e. small diffractiveness) and the white light was extracted without being significantly dispersed depending on the radiation angle.

On the other hand, as shown in Table 2, since the light-extraction layer was not provided in Comparative 1, the external quantum efficiency was low. Since Comparative 2 had a light-extraction layer and the height $d_2$, width $d_3$ and gap $d_4$ were sufficiently larger than the wavelength of the light generated in the organic emitting layer, white light could be extracted without being significantly dispersed depending on the radiation angle. However, since the distance $d_1$ was less than the optical coherence length (8.8 μm) of the light generated in the organic emitting layer, the external quantum efficiency was inferior to those in Examples 1 and 2.

Surface Plasmon Restraining Effect by Increasing the Thickness of Electron Transporting Layer Three blue fluorescent organic EL devices with different thicknesses of the electron transporting zone were prepared on high refractive index glass substrates in order to examine a restraining effect of surface plasmon.

The organic EL devices were prepared by laminating an organic EL layer on a high refractive index layer on the glass substrate by vacuum deposition in the same manner as in the above Example 1. The arrangement of the organic EL layer was as follows:

Transparent electrode: ITO (thickness: 130 nm)
Hole injecting layer: compound HI-2 (thickness: 50 nm)
Hole transporting layer: compound HT-2 (thickness: 45 nm)
Organic emitting layer: compound BH and compound BD (thickness: 20 nm, BD concentration: 5 mass %)
Electron transporting layer 1: compound ET-1 (thickness: 5 nm)
Electron transporting layer 2: compound ET-2 and Li (thickness: (X-5) nm, Li concentration: 5 mass %)
Electron injecting layer: LiF (thickness: 0.5 nm)
Opposing electrode: Al (thickness: 100 nm)

Compounds used for the organic EL device are illustrated below.

[Formula 2]

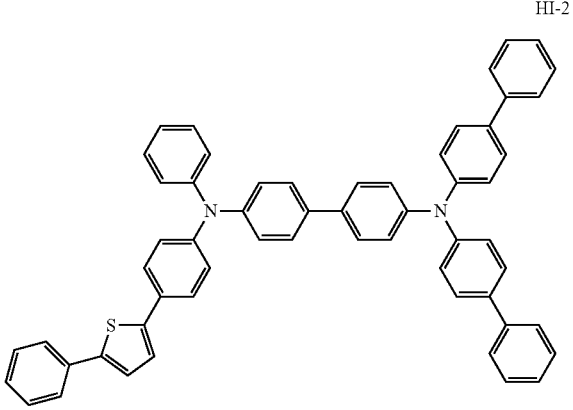

HI-2

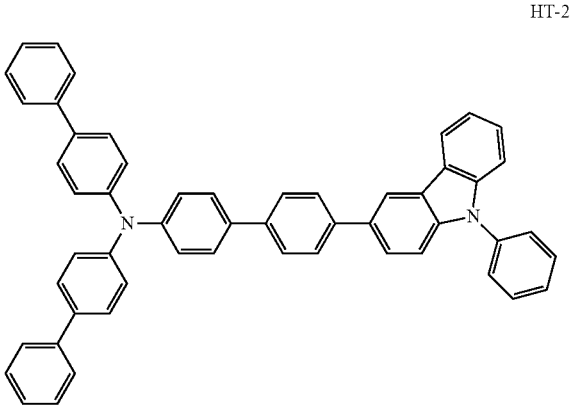

HT-2

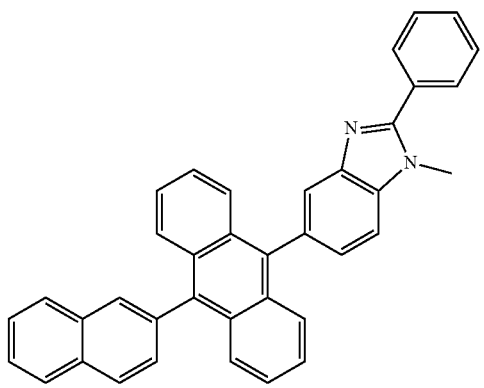

ET-1

-continued

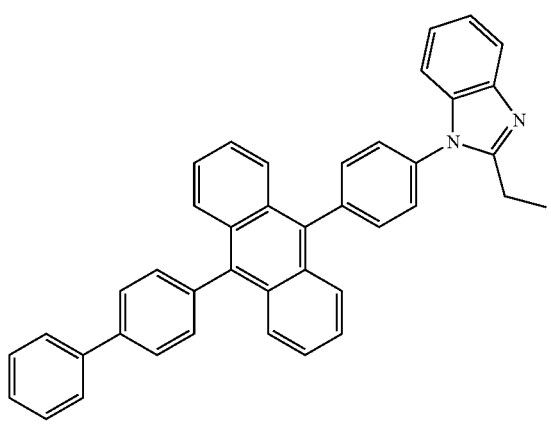

ET-2

The distances X between the cathode and the emitting layer were set at X=30 nm, X=160 nm and X=165 nm. The distance X corresponds to the thickness of the electron transporting zone. Thus, the sum of the thickness 5 nm of the electron transporting layer 1 and the thickness (X-5) nm of the electron transporting layer 2 becomes X nm.

Theoretically, the restraining effect of the surface plasmon mode can be exhibited at a thickness of approximately X=70 nm. However, in order to optimize the optical coherence length in blue emission wavelength, the above thickness was employed. Incidentally, the values of X=30 nm, X=160 nm and X=165 nm correspond to a maximum value of primary and secondary modes in an optical interference.

Under the same condition as the above drive test, the angular dependence of the emission spectrum of each of the organic EL devices of X=30 nm, X=160 nm and X=165 nm was measured to calculate the external quantum efficiency. Table 3 shows a value normalized with reference to the external quantum efficiency of the organic EL device of X=30 nm.

The SPPs mode was restrained by increasing the thickness of the electron transporting zone, and, consequently, the external quantum efficiency was enhanced.

TABLE 3

| X (nm) | External Quantum Efficiency (after being normalized by X = 30 nm) |
| --- | --- |
| 30 | 1.00 |
| 160 | 1.15 |
| 165 | 1.17 |

Example 3

A light-extraction structure in which cylindrical columns of 10 μm diameter and 1 μm height were arranged in a hexagonal closest packing structure and a gap between adjoining columns was 10 μm was formed on a glass substrate. On the light-extraction structure, an organic EL layer having a first emitting layer and a second emitting layer of the following structure was formed to provide an organic EL device according to Example 3. The first emitting layer was a blue emitting layer. The second emitting layer was a green emitting layer. The compounds were the same as that previously described.

In order to restrain the light extinction on account of surface plasmon, the distance between the second emitting layer and the cathode was kept at 90 nm in total. The thickness of each of the organic layers was determined considering a carrier balance and adjustment of optical path length in designing a tandem device.

Transparent electrode: ITO (thickness: 130 nm)
Hole injecting layer 1: compound HI-2 (thickness: 70 nm)
Hole transporting layer 1: compound HT-2 (thickness: 50 nm)
Organic emitting layer 1 (first emitting layer): compound BH and compound
BD (thickness: 20 nm, BD concentration: 5 mass %)
Electron transporting layer 1: compound ET-1 (thickness: 5 nm)
Electron transporting layer 2: compound ET-2 and Li (thickness: 5 nm, Li concentration: 5 mass %)
Charge generating layer: compound HI-3 (thickness: 5 nm)
Hole injecting layer 2: compound HI-2 (thickness: 10 nm)
Hole transporting layer 2: compound HT-2 (thickness: 30 nm)
Organic emitting layer 2 (second emitting layer): compound BH and compound GD (thickness: 20 nm, GD concentration: 5 mass %)
Electron transporting layer 3: compound ET-1 (thickness: 45 nm)
Electron transporting layer 4: compound ET-2 and Li (thickness: 45 nm, Li concentration: 5 mass %)
Electron injecting layer: LiF (thickness: 0.5 nm)
Cathode: Al (thickness: 80 nm)

Compounds used for the charge generating layer of the organic EL device according to Example 3 are illustrated below.

[Formula 3]

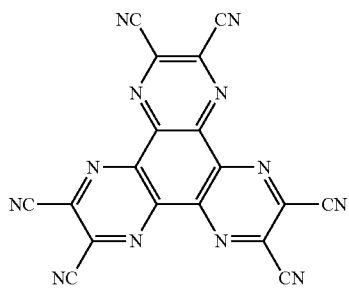

HI-3

Comparative 3

Except that no light-extraction structure was provided, the organic EL device according to the Comparative 3 was manufactured in the same manner as the Example 3.

External Quantum Efficiency

Under the same condition as in the above drive test, the angular dependence of the emission spectrum of each of the organic EL devices of Example 3 and Comparative 3 was measured and the external quantum efficiency was calculated. Table 4 shows the external quantum efficiency normalized with reference to the external quantum efficiency of Comparative 3.

TABLE 4

| | External Quantum Efficiency (after being normalized) |
|---|---|
| Example 3 | 1.75 |
| Comparative 3 (reference) | 1.00 |

Light Distribution

As a result of light distribution obtained according to measurements of the angular dependence of spectral radiance spectrum of each of Example 3 and Comparative 3, it was found that, since the radiance shape of the organic EL device having a light-extraction structure was significantly widened as compared with that of Lambertian radiation, the external quantum efficiency was significantly enhanced.

The radiation patterns of the organic EL devices of Example 3 and Comparative 3 were measured and normalized based on the external quantum efficiency of a front surface as illustrated. FIG. 16A shows a radiation pattern of the organic EL device of Example 3 after being normalized. FIG. 16B shows a radiation pattern of the organic EL device of Comparative 3 after being normalized.

INDUSTRIAL APPLICABILITY

The organic electroluminescence device according to the invention is applicable to an illumination unit as well as an emitting device such as a display device.

EXPLANATION OF CODES

1, 20, 30, 40, 50 Organic electroluminescence device (organic EL device)
2 Light-transmissive substrate
3 Light-extraction layer
31 High refractive index layer
31A, 33A, 35A Recess-protrusion unit
32 Low refractive index layer
311,331,351 Protrusions
311A Protrusion side face
311B Protrusion upper face
312,332,352 Recesses
4 Transparent electrode
5 Organic emitting layer
6 Opposing electrode
41 Electron transporting zone

The invention claimed is:

1. An organic electroluminescence device, comprising:
a transparent electrode;
an opposing electrode;
an organic emitting layer provided between the transparent electrode and the opposing electrode; and
a light-transmissive substrate, wherein
a light-extraction layer is provided adjacent to a first side of the transparent electrode opposite to a second side of the transparent electrode facing the organic emitting layer,
the light-extraction layer comprises a high refractive index layer and a low refractive index layer sequentially layered on the transparent electrode,
the light-transmissive substrate is provided adjacent to the low refractive index layer,
the light-extraction layer is placed above the opposing electrode,
the high refractive index layer comprises a plurality of recess-protrusion units each provided by a protrusion and a recess at an interface between the high refractive index layer and the low refractive index layer,
in at least one of the plurality of recess-protrusion units, a distance $d_1$ from the interface between the high refractive index layer and the low refractive index layer to an interface between the transparent electrode and the high refractive index layer is 3 μm or more, and
a height $d_2$ of the protrusion, a width $d_3$ of the protrusion and a gap $d_4$ between the protrusion and another protrusion adjoining with the protrusion across the recess are 1 μm or more.

2. The organic electroluminescence device according to claim 1, wherein
the organic electroluminescence device satisfies the following formulae (1), (2) and (3), $$|n_1 - n_H| < 0.2 \qquad (1),$$

$$|n_2 - n_L| < 0.2 \qquad (2), \text{ and}$$

$$n_H > n_L \qquad (3),$$

wherein $n_1$ represents a refractive index of the transparent electrode, $n_L$ represents a refractive index of the low refractive index layer, $n_H$ represents a refractive index of the high refractive index layer and $n_2$ represents a refractive index of the light-transmissive substrate, and the refractive indexes $n_1$, $n_L$, $n_H$ and $n_2$ represent values at a wavelength of 550 nm.

3. The organic electroluminescence device according to claim 1, wherein
the height $d_2$ of the protrusion and the width $d_3$ of the protrusion satisfy a relationship of $2.0 > d_2/d_3 > 0.2$.

4. The organic electroluminescence device according to claim 1, wherein
a side face of the protrusion along a height direction is inclined at 35 degrees or less relative to a light-extraction direction of a light generated by the organic emitting layer.

5. The organic electroluminescence device according to claim 4, wherein
the side face of the protrusion of the high refractive index layer has a shape extending along the light-extraction direction of the light generated by the organic emitting layer.

6. The organic electroluminescence device according to claim 5, wherein
an upper face of the protrusion of the high refractive index layer has a shape extending along a direction orthogonal to the light-extraction direction of the light generated by the organic emitting layer.

7. The organic electroluminescence device according to claim 1, wherein
the height $d_2$ of the protrusion, the width $d_3$ of the protrusion and the gap $d_4$ between the protrusion and another protrusion adjoining with the protrusion across the recess are 5 μm or more.

8. The organic electroluminescence device according to claim 1, wherein
an electron transporting zone having a thickness of 70 nm or more is provided between the opposing electrode and the organic emitting layer.

9. An illumination unit comprising the organic electroluminescence device according to claim 1.

10. The organic electroluminescence device according to claim 1, wherein
the height $d_2$ of the protrusion and the width $d_3$ of the protrusion satisfy a relationship of $1.0 > d_2/d_3 > 0.5$.

11. The organic electroluminescence device according to claim 2, wherein the refractive index $n_1$ of the transparent electrode is in a range of from 1.8 to 2.2.

12. The organic electroluminescence device according to claim 2, wherein the refractive index $n_2$ of the light-transmissive substrate is in a range of from 1.4 to 1.6.

13. The organic electroluminescence device according to claim 2, wherein the refractive index $n_H$ of the high refractive index layer is in a range of from 1.8 to 2.2.

14. The organic electroluminescence device according to claim 2, wherein the refractive index $n_L$ of the low refractive index layer is in a range from 1.4 to 1.6.

15. The organic electroluminescence device according to claim 1, wherein the height $d_2$, the width $d_3$ and the gap $d_4$ are 5 μm or more.

16. The organic electroluminescence device according to claim 1, wherein the height $d_2$, the width $d_3$ and the gap $d_4$ are 20 μm or more.

17. The organic electroluminescence device according to claim 1, wherein the light-transmissive substrate comprises a light-transmissive member having a light transmittance of 50% or more in a visible light range of 400 nm to 700 nm.

18. The organic electroluminescence device according to claim 1, wherein the light-transmissive substrate is a glass plate, or a polymer plate.

19. The organic electroluminescence device according to claim 1, wherein the height $d_2$, the width $d_3$ and the gap $d_4$ are in a range of from 1 μm to 1 mm.

20. The organic electroluminescence device according to claim 1, wherein the distance $d_1$ is 3.5 μm or more.

\* \* \* \* \*